United States Patent [19]

Matsuda et al.

[11] Patent Number: 5,637,535
[45] Date of Patent: Jun. 10, 1997

[54] SEMICONDUCTOR DEVICE WITH RELIABLE ELECTRODES OF PROJECTING SHAPE AND METHOD OF FORMING SAME

[75] Inventors: Tatsuharu Matsuda; Masataka Mizukoshi; Masaharu Minamizawa; Toshiyuki Motooka, all of Kawasaki, Japan

[73] Assignee: Fujitsu Limited, Kanagawa, Japan

[21] Appl. No.: 371,370

[22] Filed: Jan. 11, 1995

[30] Foreign Application Priority Data

Jan. 31, 1994 [JP] Japan .................................. 6-010060

[51] Int. Cl.⁶ ........................................................ H01L 21/60
[52] U.S. Cl. ........................... 438/106; 29/854; 438/616
[58] Field of Search ............................... 437/180, 182, 437/183, 192, 203, 209, 211, 214, 217, 219, 220

[56] References Cited

U.S. PATENT DOCUMENTS

| | | | |
|---|---|---|---|
| 5,111,279 | 5/1992 | Pasch et al. ............................ | 257/738 |
| 5,164,336 | 11/1992 | Ohno et al. ............................ | 437/192 |
| 5,171,712 | 12/1992 | Wang et al. ............................ | 437/203 |
| 5,246,880 | 9/1993 | Reele et al. ............................ | 437/203 |
| 5,468,601 | 11/1995 | Pasch ...................................... | 437/183 |
| 5,521,435 | 5/1996 | Mizukoshi ............................. | 257/738 |

*Primary Examiner*—Kevin Picardat
*Attorney, Agent, or Firm*—Armstrong, Westerman, Hattori, McLeland, & Naughton

[57] ABSTRACT

A method of forming a semiconductor device having a semiconductor chip having electrodes on which electrode pins are formed includes the steps of forming a complex having the electrode pins fixed in a fixing member, an arrangement of the electrode pins corresponding to that of the electrodes, connecting the electrode pins with the electrodes by mounting the complex on the semiconductor chip, and removing the fixing member from the complex mounted on the semiconductor chip.

16 Claims, 23 Drawing Sheets

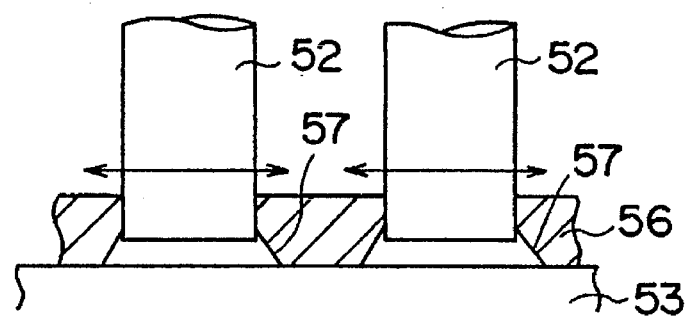
FIG. 23A
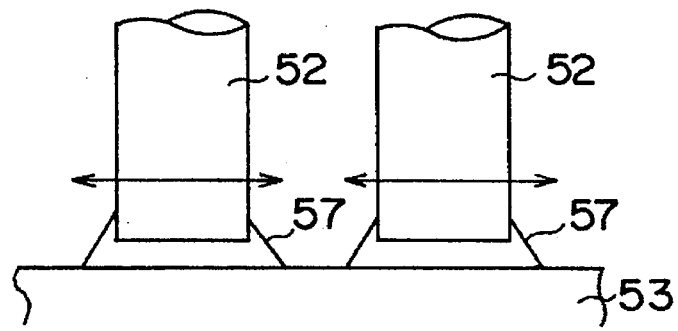
FIG. 23B
FIG. 25
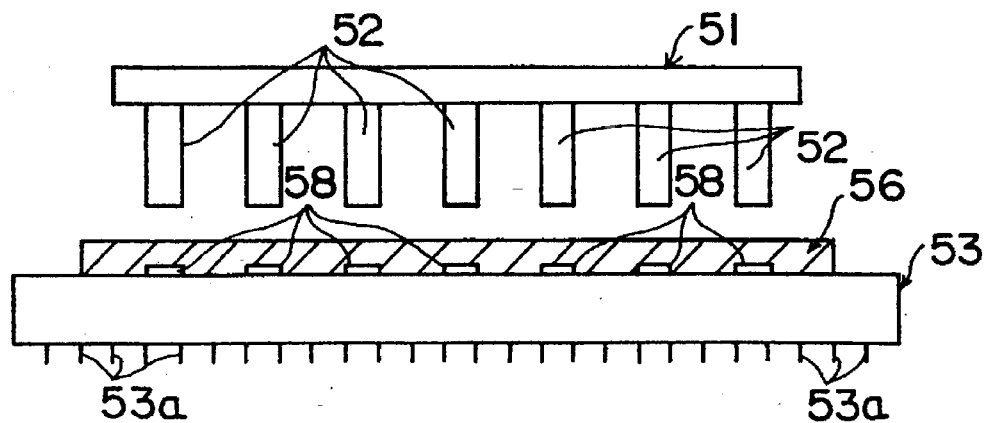

FIG. 41
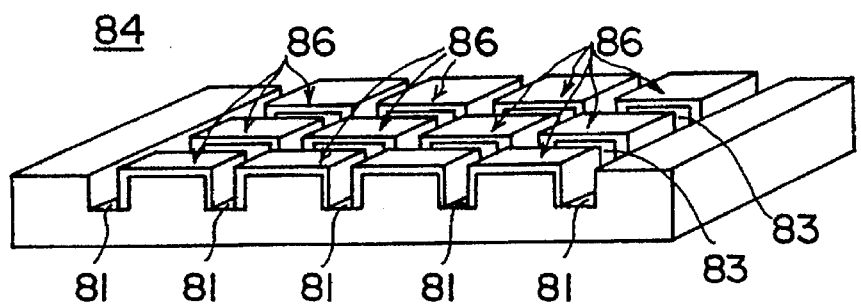
FIG. 42
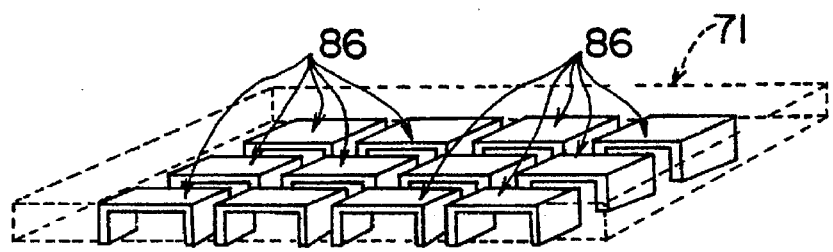
FIG. 43A  FIG. 43B  FIG. 43C  FIG. 43D
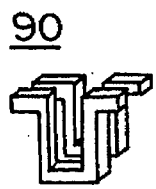 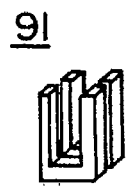  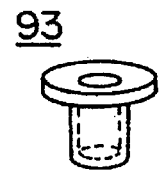

SEMICONDUCTOR DEVICE WITH RELIABLE ELECTRODES OF PROJECTING SHAPE AND METHOD OF FORMING SAME

BACKGROUND OF THE INVENTION

1. Field of the Invention

The present invention generally relates to semiconductor devices and methods of forming the same, and particularly relates to a semiconductor device which uses electrode pins (micro-pins) or protruding electrodes as coupling nodes of a semiconductor chip, and to a method of forming such a semiconductor device.

As the demand for miniaturized, high-speed, densely packaged computer systems increases, an expectation grows for development of methods of forming semiconductor devices having a large number of pins at small intervals. Also, there is a need for low-cost semiconductor devices which can negate an effect of an increasing cost caused by such demand.

In order to satisfy such an expectation and a need, a few methods for practical applications have been developed, including the flip-chip implementation method and the TAB (Tape Automated Bonding) method. In these implementation methods, electrodes of a projecting shape need to be formed on semiconductor chips. For use as such electrodes of a projecting shape, various types of electrode structures have been proposed, including electrode pins (micro-pins) and bump electrodes.

2. Description of the Prior Art

In semiconductor devices using electrode pins (micro-pins) as electrodes of a projecting shape, the following forming methods have been used in the prior art as a method of forming micro-pins on semiconductor chips.

1. Method Using Wire-Bonding Device

A method using a wire-bonding device connects one end of wires to become electrode pins with electrode pads by wirebonding, which electrode pads are formed on an assembly board or a semiconductor chip. Then, a capillary is moved up by a predetermined distance. After that, electrode pins having a predetermined length are created by spark-cutting the wires with a spark rod or by cutting the wires with a wedge.

2. Method of Attaching Electrode Pins Formed in Advance to Semiconductor Chip A method of attaching electrode pins formed in advance to a semiconductor chip forms beforehand a large number of electrode pins having a predetermined length. Also, a fixture is prepared which has holes corresponding to the arrangement of electrode pads, on which electrode pins stand. Then, the fixture is mounted on a semiconductor chip or an assembly board such that each of the holes faces a corresponding electrode pad. A large number of the electrode pins are placed on the molder, which is then vibrated by a vibrator and the like. The electrode pins fall into the holes by the vibration of the molder. After the electrode pins are inserted into all the holes, heat is applied in order to connect the electrode pins with electrode pads. When the fixture is removed from the semiconductor chip or the assembly board, the electrode pins remain standing on the electrode pads. Thus, electrode pins standing on the electrode pads are created.

3. Method of Mounting Electrode Pins on Semiconductor Chip by Forming a Complex A method of mounting electrode pins on a semiconductor chip by forming complexes first arranges a plurality of conductive leads in parallel such that the arrangement of those conductive leads corresponds to the arrangement of electrodes formed on a semiconductor chip. Those conductive leads are to become electrode pins. Then, those conductive leads are fixed in insulating resin to form a complex block. Here, the conductive leads are longer than electrode pins, so that the complex block also has a shape longer than the length of the electrode pins.

Then, part of the complex block is cut off in order to form a complex having a predetermined length. The complex thus formed comprises electrode pins of a predetermined length fixed in the insulating resin in an arrangement corresponding to the arrangement of the electrodes on the semiconductor chip. By mounting the complex on the semiconductor chip, the electrode pins provided within the complex are simultaneously connected to the electrodes on the semiconductor chip.

The electrode pins mounted on the semiconductor chip by the methods 1 to 3 described above are then connected to electrode pads formed on an assembly board. In the prior art, electrode pins are connected to electrode pads with solder by providing solder layers on both the electrode pins and electrode pads.

As for the bumps formed as electrodes of a projecting shape, solder bumps are generally used. In order to form the solder bumps, first, a metal layer which has a good connectivity (affinity) with solder is formed on electrodes on a semiconductor chip. Then, solder (e.g., a solder ball) is provided on the metal layer to be heated. The melted solder joins the electrodes, and part of the solder other than the joint part forms a spherical shape to produce a solder bump.

The methods of forming electrodes of a projecting shape and the joint structures between the electrodes and electrode pads described above have problems as follows.

In the method of forming electrode pins with a wire-bonding device, it is required to carry out a wire-bonding process for each of the electrode pins arranged in a large number. Thus, increasing the number of the electrode pins results in an increase in time required for the wire-bonding processes. This leads to a reduction in the manufacturing efficiency of the semiconductor devices.

The length of the electrode pins is defined by the position where the metal leads are cut in the wire-bonding processing. Since the cutting of the metal leads is spark-cutting or cutting with a wedge, the cutting of the metal leads has a low precision. Thus, the created electrode pins have a variation in their heights, which leads to a coupling failure when the semiconductor chip is mounted on an assembly board.

In the method of mounting electrode pins formed in advance, it is difficult to insert the micro-pins having a small diameter into all the holes formed in the molder. Also, the fixture is required to have a high precision, and, thus, becomes expensive. Accordingly, employing this method means that the manufacturing efficiency is decreased, and, at the same time, the manufacturing cost is increased.

In the method of mounting electrode pins on a semiconductor device and the like by forming a complex, the insulating resin is left remaining as well as the electrode pins after the implementation of a semiconductor chip on an assembly board. Between the electrode pins and the insulating resin and between the electrode pins and the assembly board, there are differences in thermal expansion coefficients. These differences lead to a stress applied to the joint part, when heat is generated. This results in a break-off of the joint part and the cracking of the insulating resin, reducing the reliability of the semiconductor device.

In the method of connecting electrode pins with electrode pads with solder by forming solder layers on the pins and the pads, there is a difference in thermal expansion coefficients between the semiconductor chip and an assembly board. In the event of stress, the stress is absorbed to some extent by the electrode pins bending because of the stress, if the electrode pins are formed to be exposed. However, the stress is also applied to the joint part between the electrode pins and the assembly board, which are soldered with each other at the joint part. Thus, cracks can be created at the joint part, and, in the worst case, the electrode pins can break off from the assembly board.

This problem also exists in the case of using solder bumps as electrodes of a projecting shape. The solder bumps cannot bend as can the electrode pins, and, thus, the stress generated is all applied to the joint part between the bumps and an assembly board. This means that the likelihood of cracks occurring and bumps breaking off from the assembly board is higher in this case.

Accordingly, there is a need in the field of semiconductor devices for a semiconductor device which has reliable connections between electrodes of a projecting shape and a semiconductor chip or an assembly board, and for a method of forming such a semiconductor device.

SUMMARY OF THE INVENTION

Accordingly, it is a general object of the present invention to provide a semiconductor device and a method of forming the same which satisfy the need described above.

It is another and more specific object of the present invention to provide a semiconductor device which has reliable connections between electrode pins and a semiconductor chip or an assembly board, and a method of forming such a semiconductor device.

In order to satisfy the above objects, according to the present invention, a method of forming a semiconductor device having a semiconductor chip having electrodes on which electrode pins are formed includes the steps of forming a complex having the electrode pins fixed in a fixing member, an arrangement of the electrode pins corresponding to that of the electrodes, connecting the electrode pins with the electrodes by mounting the complex on the semiconductor chip, and removing the fixing member from the complex mounted on the semiconductor chip.

Thus, according to the present invention, the completed semiconductor device does not have the fixing member attached thereto. Thus, when the semiconductor chip is mounted on the assembly board, there is no stress caused by the differences in thermal expansion coefficients between the semiconductor chip, the assembly board, and the fixing member. Also, the electrode pins are not constrained by the fixing member. Thus, even in the event of the stress caused by the difference in thermal expansion coefficients between the semiconductor chip and the assembly board, the electrode pins can absorb the stress.

Also, the above-specified objects can be achieved by a semiconductor device including a semiconductor chip on which electrode pins are formed, an assembly board on which electrode pads are formed, wherein the electrode pads are connected to the electrode pins, and a displacement-restricting member provided at connecting points between the electrode pins and the electrode pads in order to restrict displacements of the electrode pins.

Thus, in the event of the stress caused by the difference in thermal expansion coefficients between the semiconductor chip and the assembly board, the stress is broadly distributed by the displacement-restricting member. Also, since the displacements of the electrode pins are limited by the displacement-restricting member, the electrode pins do not break off from the connecting points. Thus, a reliable electrical connection can be established.

It is yet another object of the present invention to provide a semiconductor device which has reliable connections between protruding electrodes and a semiconductor chip or an assembly board, and a method of forming such a semiconductor device.

In order to achieve the above object, according to the present invention, a semiconductor device includes a semiconductor chip, an assembly board on which electrode pads are formed, and protruding electrodes capable of distorting in response to both a force applied in a direction perpendicular to and a force applied in a direction parallel to major surfaces of the semiconductor chip, the protruding electrodes being formed on the semiconductor chip and connected to the electrode pads.

Thus, according to the present invention, in the event of the stress caused by the difference in thermal expansion coefficients between the semiconductor chip and the assembly board, the protruding electrodes capable of distorting can absorb the stress. Also, when there is a variation in the heights of the protruding electrodes, the protruding electrodes capable of distorting in response to a force applied in a direction perpendicular to the major surfaces of the semiconductor chip can absorb the variation. This is done by pushing the semiconductor chip against the assembly board so as to distort the protruding electrodes. Thus, a reliable electrical connection between the semiconductor chip and the assembly board can be established. Also, the semiconductor chip can be readily made parallel to the assembly board.

Other objects and further features of the present invention will be apparent from the following detailed description when read in conjunction with the accompanying drawings.

BRIEF DESCRIPTION OF THE DRAWINGS

FIGS. 23A and 23B are illustrative drawings showing connecting points between electrode pins and an assembly board;

FIG. 25 is an illustrative drawing showing a process of mounting a semiconductor chip on an assembly board, on which a displacement-restricting resin is provided;

FIG. 41 is an illustrative drawing showing second grooves formed on the substrate so as to cut the conductive members to form protruding electrodes;

FIG. 42 is an illustrative drawing showing the protruding electrodes of FIG. 41 attached to a semiconductor chip;

FIGS. 43A to 43D are illustrative drawings showing variations of the protruding electrodes.

DESCRIPTION OF THE PREFERRED EMBODIMENTS

In the following, a description will be given of principles and embodiments of the present invention with reference to accompanying drawings.

In the present invention, methods of forming electrode pins (micro-pins) or protruding electrodes (bumps) on a semiconductor chip are a point of novelty. Since methods such as forming a semiconductor chip are not different from those used in the prior art, only the methods of forming electrode pins or protruding electrodes will be described below.

Figure 1:
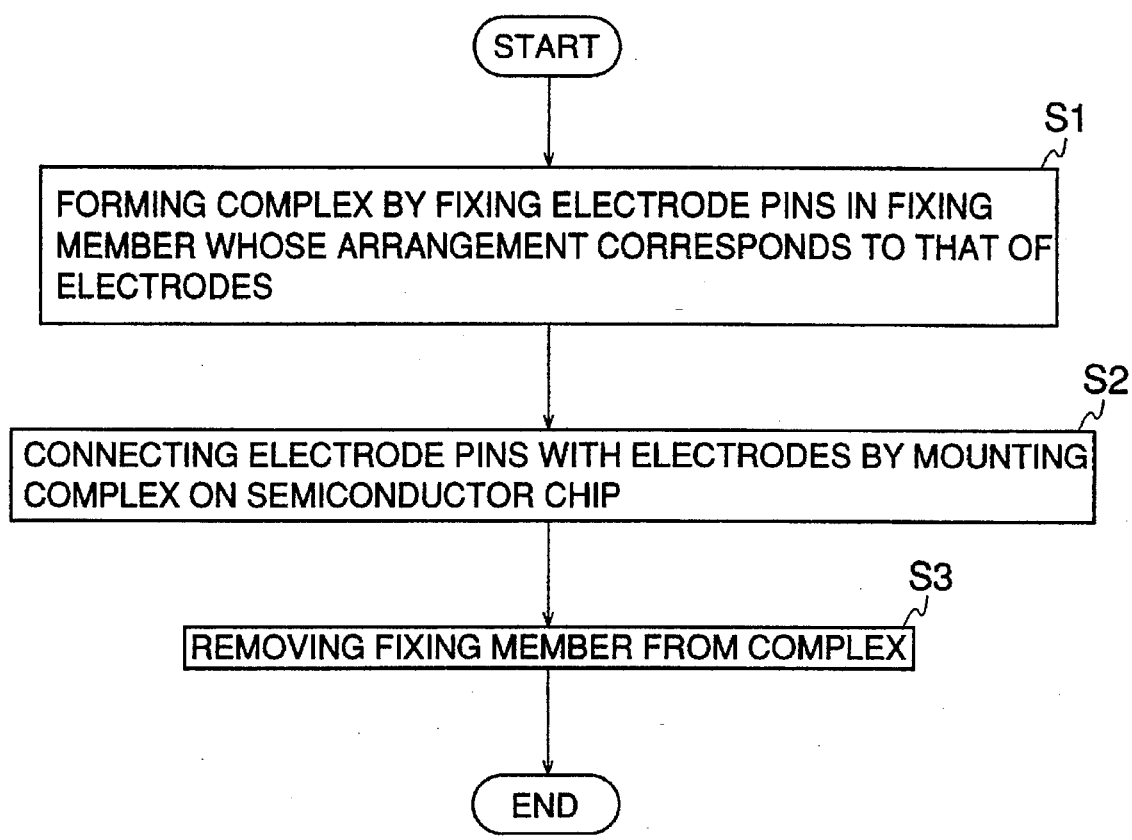
FIG. 1 is a flow chart of a method of forming electrode pins on a semiconductor chip according to a first principle of the present invention.

FIG. 1 shows a flow chart of a first principle of the present invention.

In FIG. 1, at a step S1, a complex having the electrode pins fixed in a fixing member is formed by fixing the electrode pins in the fixing member, where the arrangement of the electrode pins corresponds to that of electrodes on a semiconductor chip.

At a step S2, the electrode pins are connected with the electrodes on the semiconductor chip by mounting the complex on the semiconductor chip.

At a step S3, the fixing member is removed from the complex so that only the electrode pins remain on the semiconductor chip.

Thus, according to the first principle of the present invention, the completed semiconductor chip does not have the fixing member attached thereto. Thus, when the semiconductor chip is mounted on the assembly board, there is no stress caused by differences in thermal expansion coefficients between the semiconductor chip, the assembly board, and the fixing member. Also, the electrode pins are not constrained by the fixing member. Thus, even in the event of stress caused by the difference in thermal expansion coefficients between the semiconductor chip and the assembly board, the electrode pins can absorb the stress.

Figure 2:
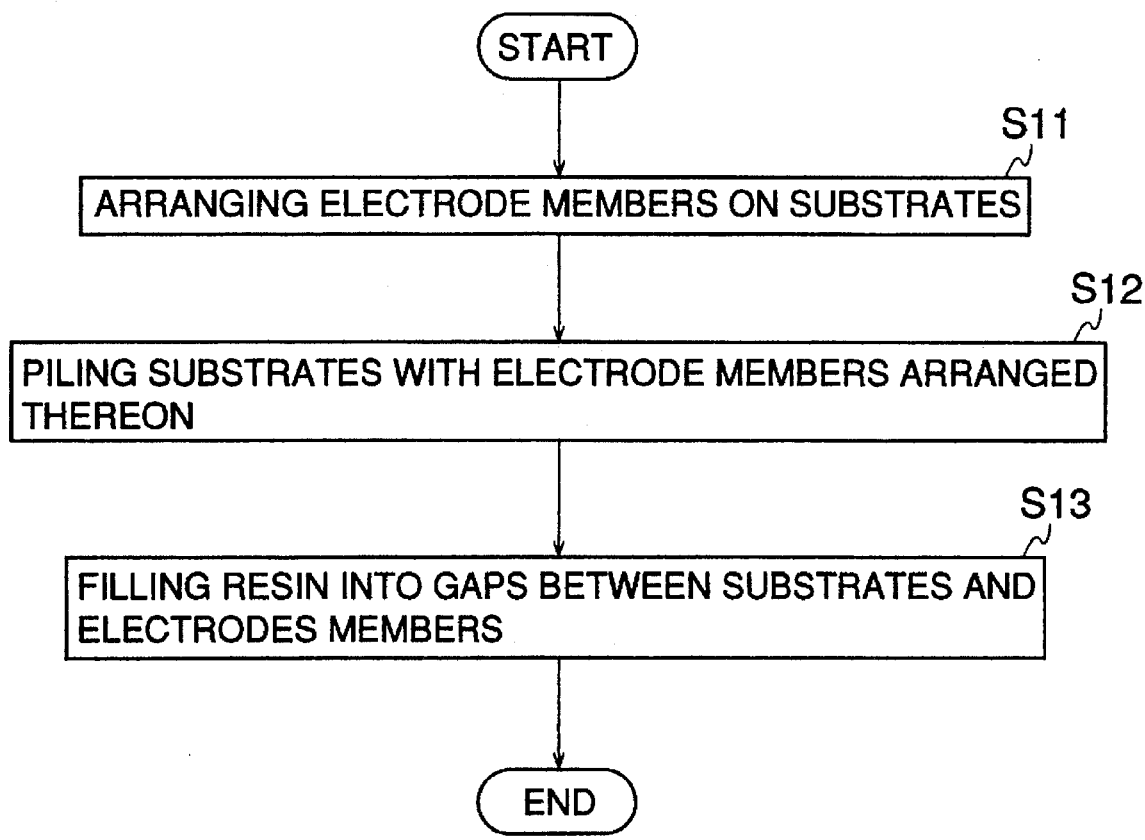
FIG. 2 is a flow chart of a first embodiment of a method of forming a complex of FIG. 1.

FIG. 2 show a flow chart of a first embodiment of a method of forming a semiconductor device according to the first principle of the present invention. With reference to FIG. 2, this first embodiment will be described below.

In FIG. 2, only the steps which make up the step S1 of FIG. 1 are shown.

At a step S11, electrode members to become the electrode pins are arranged on substrates. At a step S12, the substrates are piled one over another with the arranged electrode members placed therebetween. At a step S13, a resin is filled into the gaps between the electrode members and the substrates so as to form a complex.

In this manner, the complex having the electrode pins fixed in the fixing member is formed. Details of this first embodiment will be described below with reference to FIG. 3 to FIG. 8.

Figure 3:
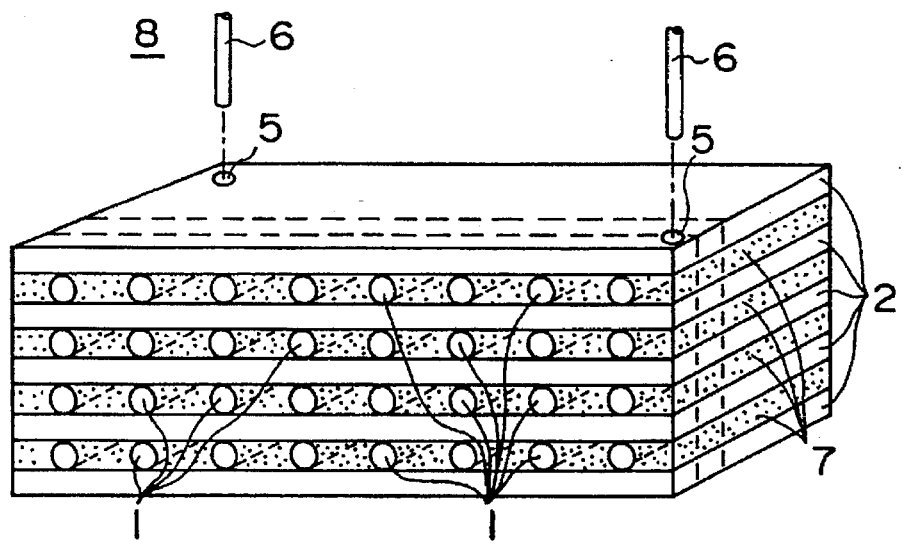
FIG. 3 is an illustrative drawing showing a complex block including the electrode pins, substrates, and glue.

As shown in FIG. 3, in the first embodiment of the method of forming a semiconductor device, electrode members 1 having a cylindrical shape to become electrode pins and substrates 2 of a plane shape are prepared, and the substrates 2 are piled one over another with the electrode members 1 placed between them. The electrode members 1 are arranged so as to correspond to the arrangement of electrode parts 4 formed beforehand in a different process on a semiconductor chip 3 (shown in FIG. 6).

The electrode members 1 are made of conductive metal such as copper (Cu), gold (Au), or aluminum (Al), and have a longer length than a predetermined length of the electrode pins. The substrates 2 are made of insulating silicon resin such as KE-26 (product name) of Shin-etsu Chemical Company, and have an appropriate thickness for the arrangement of the electrode members 1 to correspond to the arrangement of the electrode parts 4.

When piling the substrates 2 one over another with the electrode members 1 between them, positioning grooves are provided at the locations of the substrates 2 where the electrode members 1 are to be arranged so as to make it easy to position the electrode members 1. Also, positioning holes 5 are formed through the substrates 2. By inserting positioning pins 6 through the positioning holes 5, the positioning of each of the substrates 2 can be easily carried out.

After piling the substrates 2, glue 7 is filled into the gaps between the electrode members 1 and the substrates 2. The glue 7 is made of silicon which is the same material as the substrates 2. The electrode members 1 and the substrates 2 are fixed together with the glue 7 to form a complex block 8. Thus, the substrates 2 and the glue 7 collectively serve as a fixing member for fixing the electrode members 1.

Figure 4:
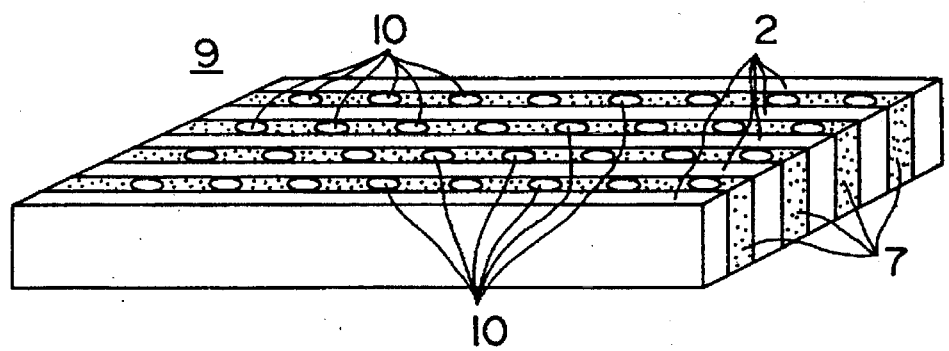
FIG. 4 is an illustrative drawing showing a complex cut out from the complex block of FIG. 3.

After forming a complex block 8 as described above, the complex block 8 is cut into a predetermined thickness (along dotted lines shown in FIG. 3) so as to form a complex 9 shown in FIG. 4.

In creating the complex 9 of FIG. 4, the electrode members 1 are cut along with the substrates 2 and the glue 7 so as to form the electrode pins (micropins) 10. At this point of time, the electrode pins 10 are still fixed in the glue 7 and the substrates 2, so that the electrode pins 10 are arranged at the locations corresponding to the arrangement of the electrode parts 4.

Figure 5:
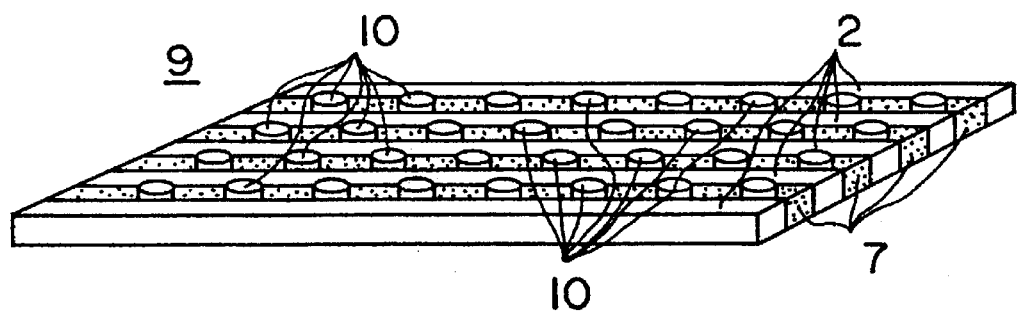
FIG. 5 is an illustrative drawing showing a complex of FIG. 4 in which the substrates and the glue are partially removed to expose part of the electrode pins.

After forming the complex 9 as described above, the substrates 2 and the glue 7 are etched so as to expose both ends of the electrode pins 10 from the substrates 2 and the glue 7. This is shown in FIG. 5. In FIG. 5, the lower ends of the electrode pins 10 cannot be seen, since they are exposed beneath the substrates 2 and the glue 7. The parts of the electrode pins 10 exposed from the substrates 2 and the glue 7 are cleaned. Depending on the material used for the electrode pins 10, if necessary, the exposed part of the electrode pins 10 are covered with a conductive metal layer formed by electroplating and the like.

Figure 6:
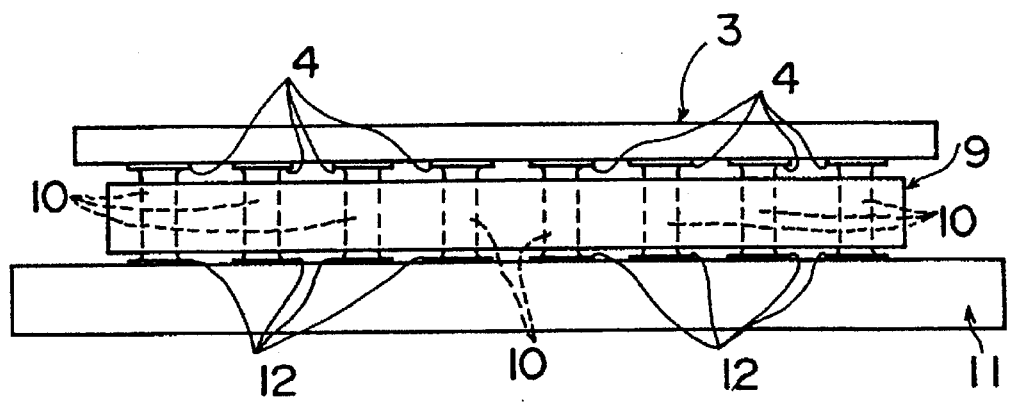
FIG. 6 is an illustrative drawing showing the complex of FIG. 5 attached to a semiconductor chip and an assembly board.

After cleaning the exposed parts of the electrode pins 10, the complex 9 is connected to a semiconductor chip 3, and, then, connected to an assembly board 11. FIG. 6 shows the complex 9 connected to the semiconductor chip 3 and the assembly board 11.

As mentioned above, the semiconductor chip 3 is formed in a manufacturing process well known to the art, and has a plurality of the electrode parts 4 at the bottom surface. The electrode pins 10 of the complex 9 are arranged to correspond to the arrangement of the electrode parts 4, so that the positioning of the electrode pins 10 relative to the electrode parts 4 need not be carried out for each of the electrode pins 10. Rather, appropriate positioning is readily achieved by positioning the complex 9 relative to the semiconductor chip 3.

The connection of the electrode pins 10 with the electrode parts 4 is done by soldering. Namely, solder paste and the like is provided on both or one of the electrode pins 10 and the electrode parts 4. One ends of the electrode pins 10 and electrode parts 4 in contact with each other are subject to a heat process so as to be connected. Since the electrode pins 10 are exposed from the substrates 2 and the glue 7 comprising the complex 9, solder paste and the like can be readily pasted on the electrode pins 10. Also, connecting the electrode pins 10 with the electrode parts 4 can be readily and reliably carried out.

The assembly board 11 is connected with the complex 9 in the same manner as connecting the semiconductor chip 3 with the complex 9. Namely, the lower ends of the electrode pins 10 are soldered to electrode pads 12, which are formed on the upper surface of the assembly board 11 facing the semiconductor chip 3. Those electrode pads 12 are arranged at locations corresponding to the locations of the electrode parts 4, so that the electrode pads 12 have the same arrangement as the electrode pins 10. Thus, the positioning of the electrode pins 10 relative to the electrode pads 12 can be readily carried out. Also, since the lower ends of the electrode pins 10 are exposed, the pasting of solder and the like and the connecting of the electrode pins 10 with the electrode pads 12 can be readily and reliably carried out. At this point of time, the substrates 2 and the glue 7 serving as a fixing member for fixing the electrode pins 10 still remain.

After connecting the complex 9 with the semiconductor chip 3 and the assembly board 11, the substrates 2 and the glue 7 are removed, which constitutes a main part of the present invention.

Figure 7:
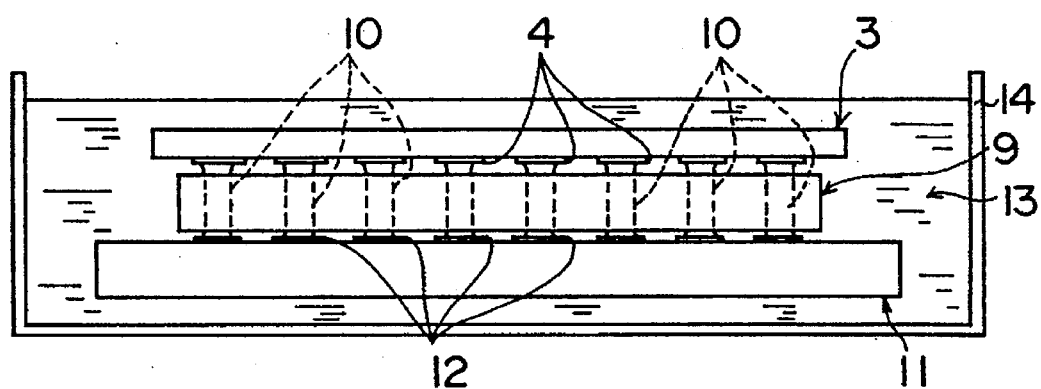
FIG. 7 is an illustrative drawing showing a process of removing the substrates and the glue from the complex of FIG. 6 so as to keep only the electrode pins attached to the semiconductor chip and the assembly board.

FIG. 7 shows an example of a process of removing the substrates 2 and the glue 7 of the complex 9. In this embodiment, as shown in FIG. 7, the semiconductor chip 3 connected with the assembly board 11 is immersed in organic solution 13 contained in a solution container 14. Thus, the substrates 2 and the glue 7 are dissolved to be removed. In the case that silicon resin is used for the substrates 2 and the glue 7, URESOLVE PLUS (product name) of Dynaroy corporation may be used as the organic solution 13. In using this organic solution 13, the process temperature may be set to 70° C. to 90° C., and the processing time may be set to one hour.

Materials which are not affected by the organic solution 13 may be used for the electrode pins 10, the electrode parts 4, the electrode pads 12, the outer protection layer of the semiconductor chip 3, and the assembly board 11. By using such material, the substrates 2 and the glue 7 are removed without affecting the components listed above. Thus, the electrical connections between the electrode pins 10 and both the electrode parts 4 and the electrode pads 12 can remain reliable.

As described above, the use of the organic solution 13 for dissolving the substrates 2 and the glue 7 makes it possible to remove them with a simple process. That is, the substrates 2 and the glue 7 can be removed by simply immersing the complex 9 with the semiconductor chip 3 into the organic solution 13. This results in realization of an efficient removal process.

Figure 8:
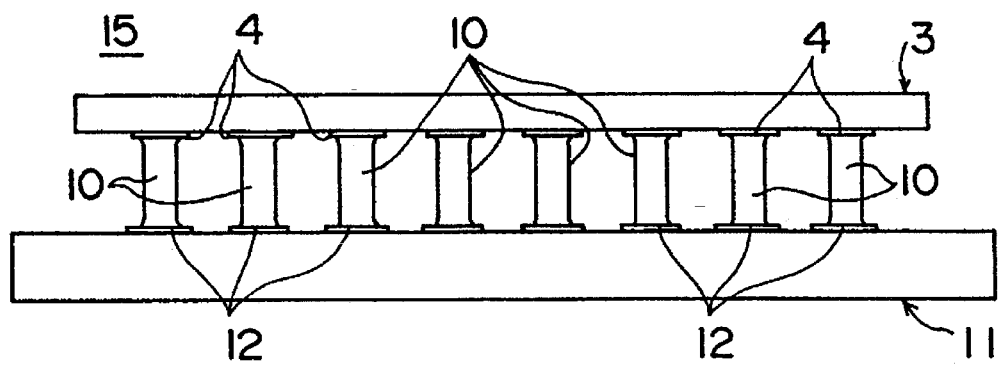
FIG. 8 is an illustrative drawing showing a completed semiconductor device based on the first embodiment method according to the first principle of the present invention.

FIG. 8 shows a semiconductor device 15 in completion. In the semiconductor device 15, the semiconductor chip 3 and the assembly board 11 are connected together through the electrode pins 10 only, since the substrates 2 and the glue 7 have been removed. Thus, there is no stress caused by differences in thermal expansion coefficients between the semiconductor chip 3, the fixing member 2 and 7, and the assembly board 11. This contrasts with semiconductor devices of the prior art which are subject to such stress because of the substrates 2 and the glue 7 left remaining. Nonetheless, there is some stress generated by the thermal expansion difference between the semiconductor chip 3 and the assembly board 11. Even in the event of this stress, the electrode pins 10 can bend to absorb the stress, since there is no constraint which would be caused by the substrates 2 and the glue 7. Accordingly, the connections of the electrode pins 10 with both the electrode parts 4 and the electrode pads 12 can be made strong, enhancing the reliability of the semiconductor device 15.

Figure 9:
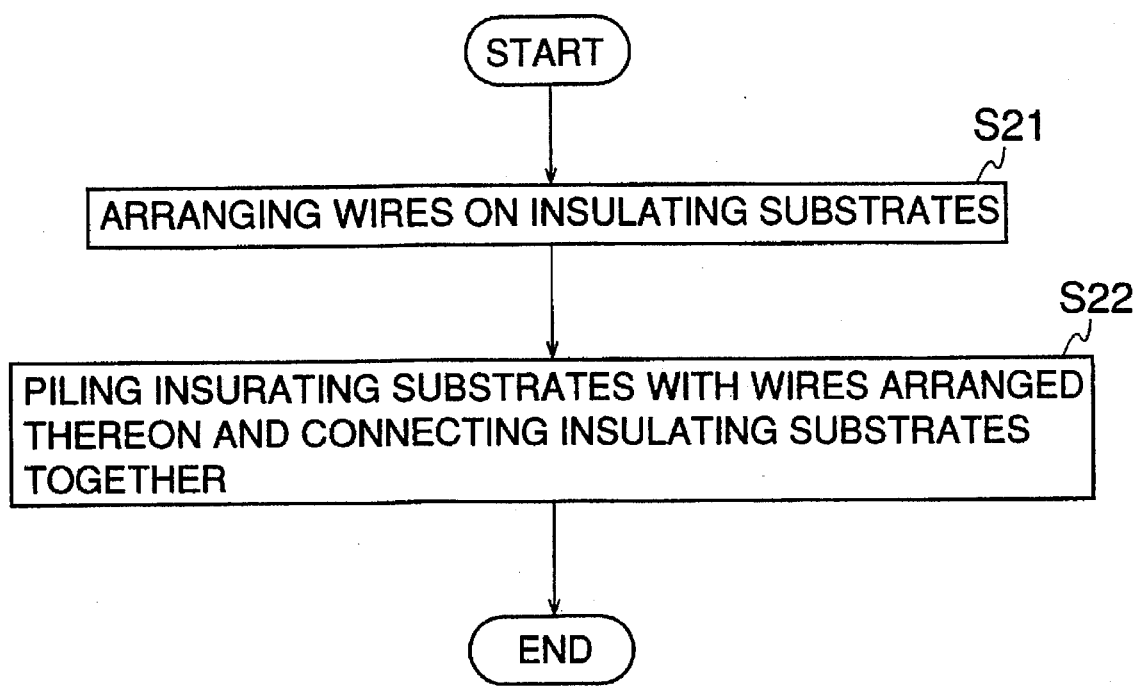
FIG. 9 is a flow chart of a second embodiment of a method of forming a complex of FIG. 1.

FIG. 9 shows a flow chart of a second embodiment of a method of forming a semiconductor device according to the first principle of the present invention.

In FIG. 9, only the steps which make up the step S1 of FIG. 1 are shown.

At a step S21, wires to become the electrode pins are arranged on insulating substrates. At a step S22, the insulating substrates are piled one over another with the wires placed there between, and, at the same time, are connected with each other.

In this manner, the complex having the electrode pins fixed in the fixing member is formed. Details of this second embodiment will be described below with reference to FIG. 10 to FIG. 21.

Figure 10:
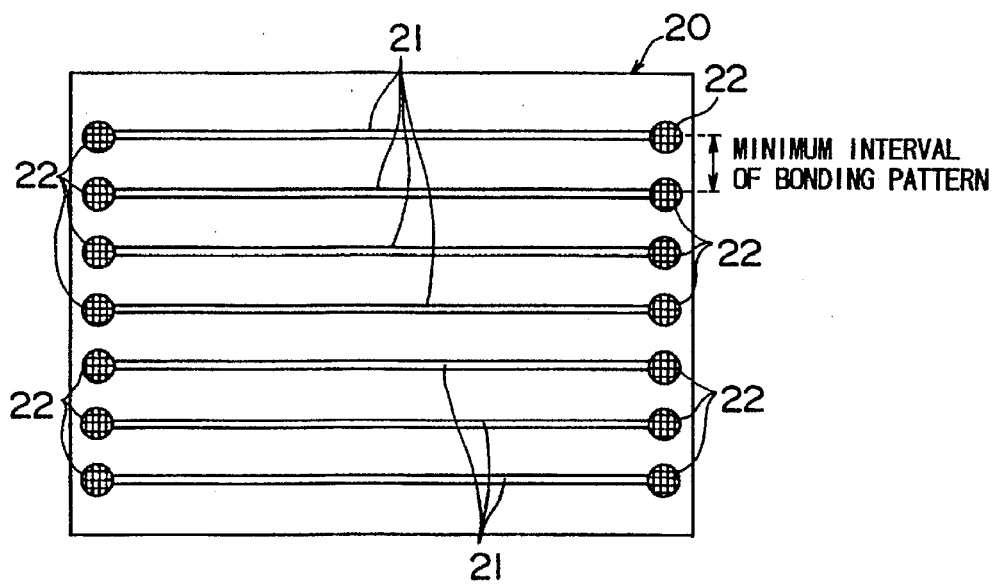
FIG. 10 is an illustrative drawing showing wires arranged on an insulating substrate.

As shown in FIG. 10, in the second embodiment of the method of forming the semiconductor device, wires 21 to become electrode pins are provided on a substrate 20 of a plane shape. A wire-bonding device used in a manufacturing process of semiconductor chips is used for providing the wires 21. In FIG. 10, bonding patterns 22 are formed at both ends of each of the wires 21.

The wires 21 are made of conductive metal such as copper (Cu), gold (Au), or aluminum (Al), and have a longer length than a predetermined length of the electrode pins. The wires 21 are arranged in locations corresponding to the locations of electrode parts 36 formed on a semiconductor chip 34 (shown in FIG. 19). Thus, as spacing between the electrode parts 36 is decreased because of a larger number of the electrode parts 36 in a higher integration-density semiconductor chip 34, the spacing between the wires 24 should also be decreased.

Figure 11:
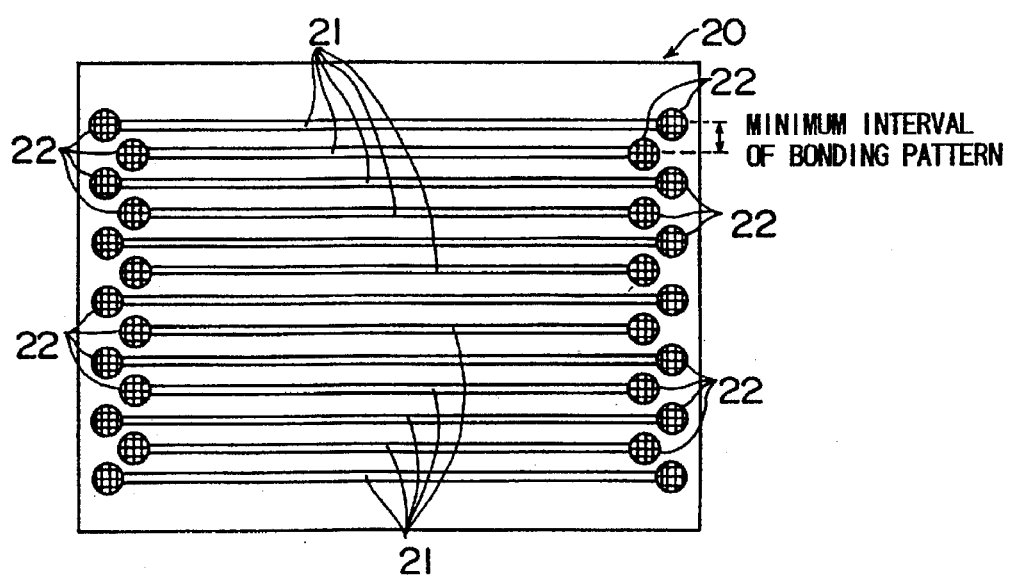
FIG. 11 is an illustrative drawing showing another pattern of a wire arrangement on an insulating substrate.

Since the bonding patterns 22 have a larger diameter than do the wires 21, the spacing of the wires 21 is limited by the diameter of the bonding patterns 22. In order to eliminate this limitation, the bonding patterns 22 can be arranged staggered as shown in FIG. 11, so that the spacing between them can be made smaller than that of the no-staggered arrangement shown in FIG. 10. In this manner, the spacing of the wires 21 can be made small so as to be suitable for a semiconductor chip of a high integration density.

Figure 12:
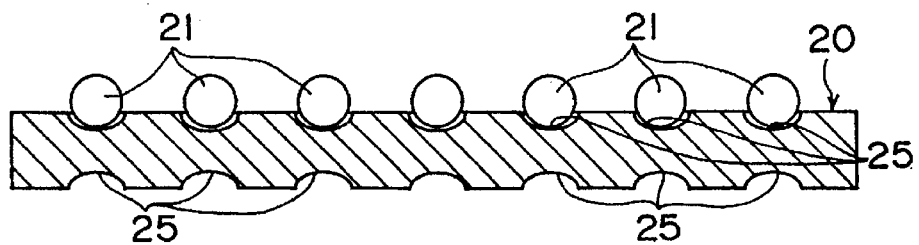
FIG. 12 is an illustrative drawing showing grooves formed on the insulating substrate and showing the wires arranged in the grooves.

In a simple arrangement of the wires 21 on the substrate 20, it is possible for the wires 21 to be loose enough to move up and down in the figures, so that the wires 21 might be dislocated from the locations corresponding to those of the electrode parts 36. In order to prevent the dislocation, positioning grooves 25 are formed on the substrate 20 at predetermined wire locations as shown in FIG. 12. The wires 21 are fitted into the positioning grooves 25 to prevent the dislocation, thus enhancing a precision of positioning of the wires 21.

Figure 13:
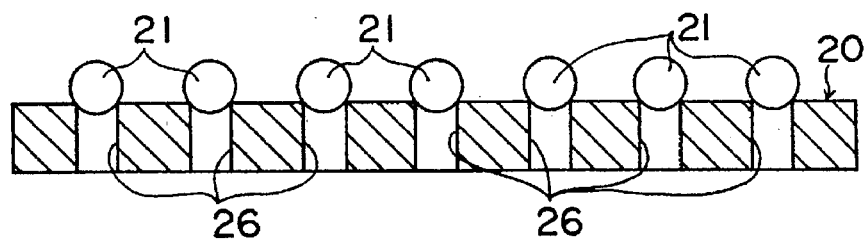
FIG. 13 is an illustrative drawing showing holes formed through the insulating substrate and showing the wires arranged in the holes.

The positioning grooves 25 are formed not only on the top surface where the wires 21 are to be provided, but also on the bottom surface of the substrate 20. The reason is because when a plurality of the substrates 20 are piled one over another, the positioning of the substrates 20 over each other is also carried out by using the positioning grooves 25. Here, means for positioning the wires 21 on the substrate 20 is not limited to the positioning grooves 25, but, as shown in FIG. 13, elongated holes 26 formed through the substrate 20 along the location of the wires 21 can also serve as such means.

Figure 14:
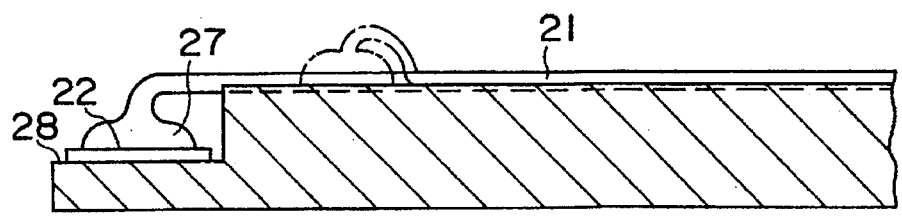
FIG. 14 is an illustrative drawing showing a lowered surface formed on a side of the insulating substrate, on which surface the wires are connected by wire-bonding.

Also, the arrangement of FIG. 14 can be used for preventing the wires 21 from being loose.

Usually, when a wire-bonding device is used for forming the wires 21, the bonding patterns 22 are formed at both ends of the wires 21. The resulting arrangement is that the wires 21 are originating from the top of a nail head 27 formed on the bonding patterns 22. Thus, when the bonding patterns 22 are formed on the top surface of the substrate 20, the wires 21 originate from a higher position than the top surface of the substrate 20, as shown in FIG. 14 by dotted curved lines. The wires 21 are then dropped on the top surface of the substrate 20. With this configuration, the wires 21 are likely to be slack.

As shown in FIG. 14, the bonding patterns 22 can be formed on a lowered surface 28, which is positioned lower than the top surface of the substrate 20. With this configuration, the wires 21 end up originating from a position lower than the top surface of the substrate 20. Thus, there is no slack in the wires 21, so that the dislocation of the wires 21 can be prevented.

Figure 15A:
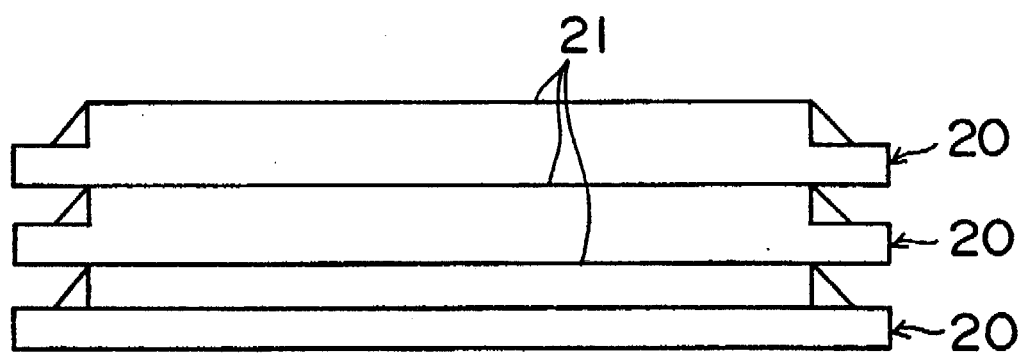
FIGS. 15A and 15B are illustrative drawings showing the insulating substrates piled one over another.
Figure 15B:
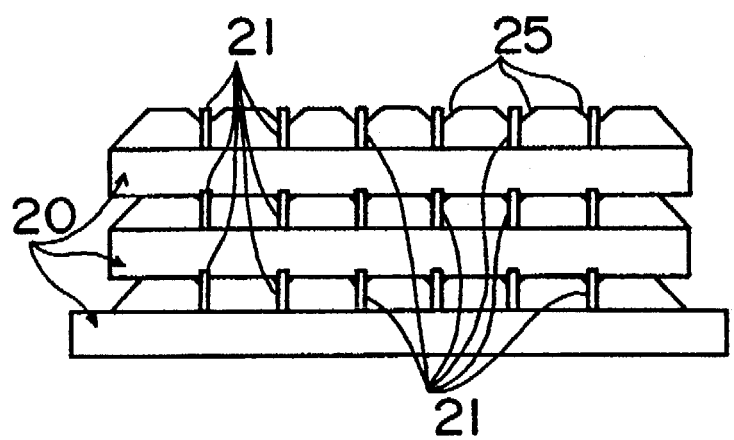

After providing the wires 21 on the substrate 20 as described above, the substrates 20 are piled one over another as shown in FIGS. 15A and 15B. As described earlier, the positioning grooves 25 or the elongated holes 26 are formed on both surfaces of the substrates 20. In piling up the substrates 20, the wires 21 provided on the top surface of one substrate 20 are fitted into the positioning grooves 25 or the elongated holes 26 formed on the bottom surface of another substrate 20. In this manner, the positioning of substrates 20 over one another can be readily accomplished.

Figure 16:
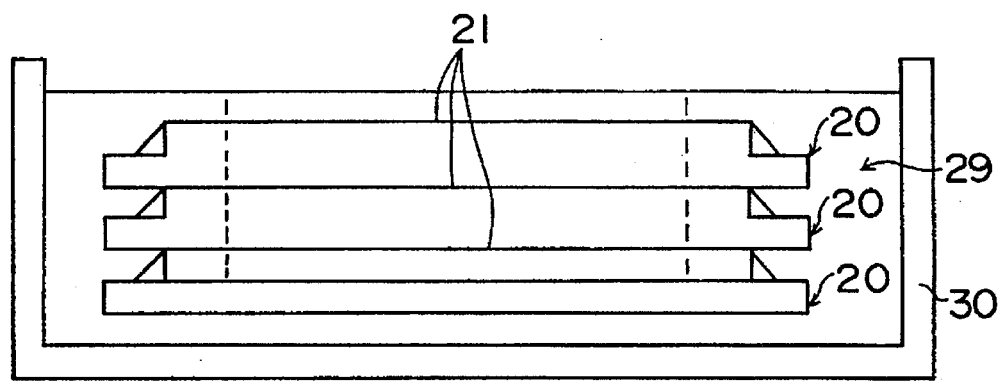
FIG. 16 is an illustrative drawing showing the piled insulating substrates immersed in a fixing resin in order to connect the insulating substrates together.
Figure 17:
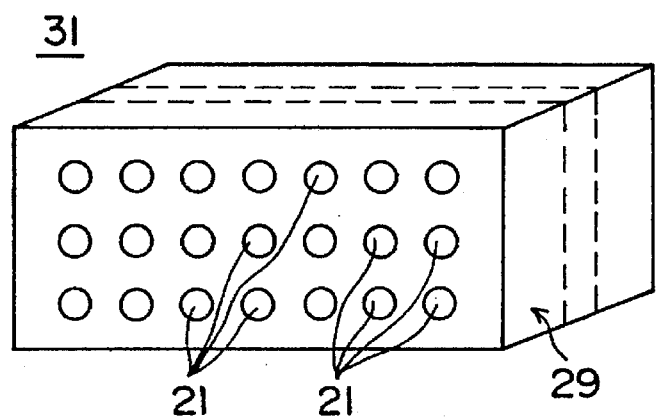
FIG. 17 is an illustrative drawing showing a complex block formed by the second embodiment of the method of forming a complex.

The substrates 20 in a pile are immersed in fixing resin 29 which is in a liquid state and filled in a container 30. The fixing resin 29 is then cooled to be solidified while containing the substrates 20. After that, the fixing resin 29 burying the substrates 20 is taken out of the container 30, and, then, is cut into a predetermined size of a complex block 31. This is shown in FIG. 17. (Dotted lines in FIG. 16 show lines along which the fixing resin 29 is cut.) The complex block 31 has a structure that the cross-sections of the wires 21 are exposed from the fixing resin 29.

Figure 18:
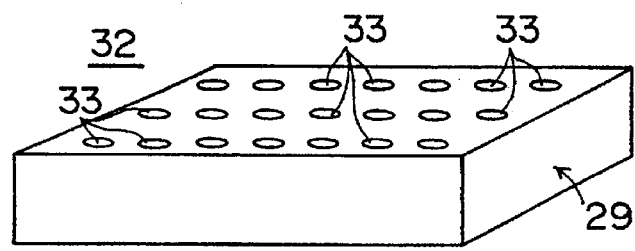
FIG. 18 is an illustrative drawing showing a complex cut out from the complex block of FIG. 17.

After forming the complex block 31, the same process as that of the first embodiment is applied. Namely, the complex block 31 is cut at predetermined locations to form complexes 32, one of which is shown in FIG. 18. Dotted lines in FIG. 17 show lines along which the complex block 31 is cut into the complexes 32. In FIG. 18, the wires 21 are cut along with the fixing resin 29 and the substrate 20 to form electrode pins (micro-pins) 33.

Figure 19:
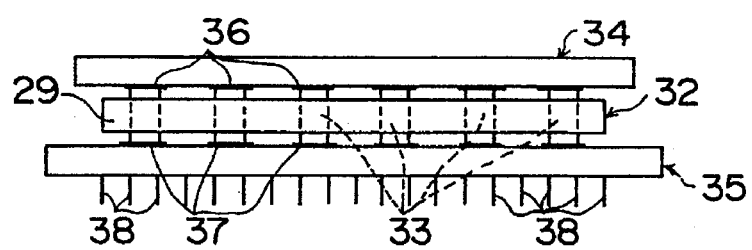
FIG. 19 is an illustrative drawing showing the complex of FIG. 18 attached to a semiconductor chip and an assembly board.

After forming the complex 32, the complex 32 is etched so as to expose both ends of the electrode pins 33 from the fixing resin 29 and the substrate 20. Then, the complex 32 is connected to a semiconductor chip 34 and an assembly board 35 as shown in FIG. 19.

The connection of the electrode pins 33 with the electrode parts 36 is done by soldering. Namely, solder paste and the like is provided on both or one of the electrode pins 33 and the electrode parts 36, and ends of the electrode pins 33 and electrode parts 36 in contact with each other are subject to a heat process so as to be connected. Since the electrode pins 33 are exposed from the fixing resin 29 and the substrate 20, solder paste and the like can be readily pasted on the electrode pins 33. Also, the positioning and connecting of the electrode pins 33 with the electrode parts 36 can be readily and reliably carried out. The connection of the complex 32 with the assembly board 35 (e.g., the connection of the electrode pins 33 to electrode pads 37) is also carried out in the same manner as in the first embodiment. After the electrode pins 33 are connected to the electrode parts 36 and to the electrode pads 37, the fixing resin 29 serving as a fixing member still remains. Also, as shown in FIG. 19, connection pins 38 extend downward in this embodiment.

Figure 20:
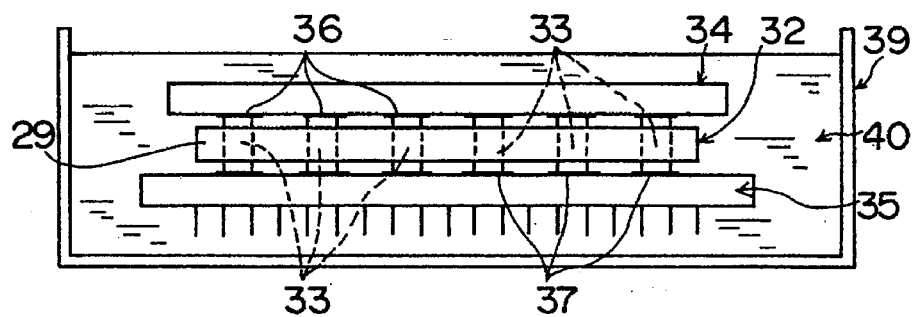
FIG. 20 is an illustrative drawing showing a process of removing the insulating substrates from the complex of FIG. 19 so as to keep only the electrode pins attached to the semiconductor chip and the assembly board.

After the complex 32 is connected to the semiconductor chip 34 and the assembly board 35, a process of removing the fixing resin 29 and the substrate 20 is carried out. FIG. 20 shows the process of removing the fixing resin 29 and the substrate 20 of the complex 32. As shown in FIG. 20, the semiconductor chip 34 attached to the assembly board 35 is immersed in an organic solution 40 contained in a solution container 39 so as to dissolve the fixing resin 29 and the substrate 20.

As described above, in the case that silicon resin is used for the fixing resin 29, URESOLVE PLUS (product name) of the Dynaroy corporation may be used as the organic solution 40. When this organic solution is used in this embodiment, the processing temperature may be set to 70° C. to 90° C., and the processing time may be set to one hour, as in the first embodiment. Also, materials which are not affected by the organic solution 40 is used for the electrode pins 33, the electrode parts 36, the electrode pads 37, the outer protection layer of the semiconductor chip 34, and the assembly board 35.

As described above, the use of the organic solution 40 for dissolving the fixing resin 29 and the substrate 20 can simplify the removal process. That is, the fixing resin 29 and the substrate 20 can be removed by simply immersing the complex 32 with the semiconductor chip 34 and the assembly board 35 into the organic solution 40. This results in realization of an efficient removal process.

Figure 21:
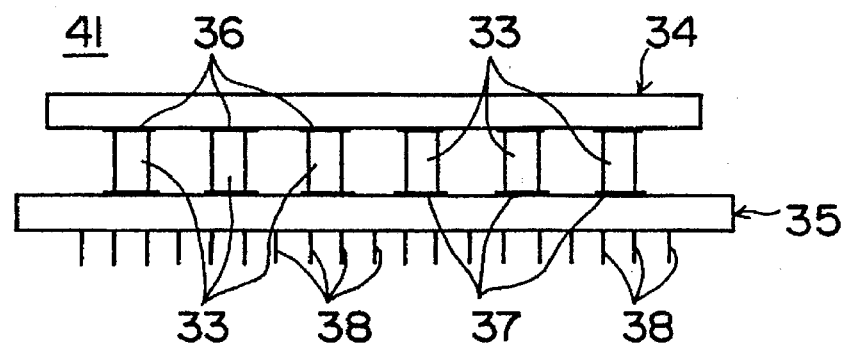
FIG. 21 is an illustrative drawing showing a completed semiconductor device based on the second embodiment method according to the first principle of the present invention.

FIG. 21 shows a semiconductor device 41 in completion. In the semiconductor device 41, the semiconductor chip 34 and the assembly board 35 are connected together through the electrode pins 33 only, since the fixing resin 29 and the substrate 20 have been removed. When there is stress generated by a thermal expansion difference between the semiconductor chip 34 and the assembly board 35, the electrode pins 33 can bend to absorb the stress. Accordingly, the connections of the electrode pins 33 with both the semiconductor chip 34 and the assembly board 35 can be made strong, enhancing the reliability of the semiconductor device 41.

In the first and second embodiments of the present invention, the substrates 2 and 20, the glue 7, and the fixing resin 29 are removed by a solution which can dissolve them. However, the method of removal is not limited to that of the above description. The substrates 2 and 20, the glue 7, and the fixing resin 29 may be made of materials having a melting point lower than that of the electrode pins 10 and 33, so that they can be removed by melting in a heat process. Or the substrates 2 and 20, the glue 7, and the fixing resin 29 may be made of materials which have a stronger proclivity to be dissolved by an inorganic solution such as a sulfate than that of the electrode pins 10 and 33. Then, immersing the substrates 2 and 20, the glue 7, and the fixing resin 29 into an inorganic solution can remove them. Other methods of removing the substrates 2 and 20, the glue 7, and the fixing resin 29 can be designed by utilizing a material difference between those which are removed and those which remain.

In the following, a description will be given of a second principle of the present invention.

Figure 22:
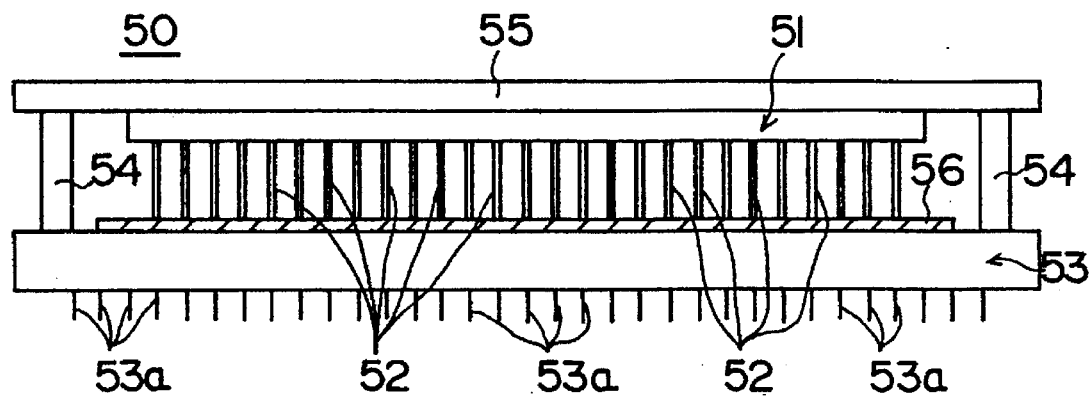
FIG. 22 is an illustrative drawing showing a first embodiment of a semiconductor device according to a second principle of the present invention.

FIG. 22 shows a first embodiment of a semiconductor device 50 according to the second principle of the present invention. In FIG. 22, a semiconductor chip 51 includes a plurality of electrode pins (micro-pins) 52 therebelow. An assembly board 53 is positioned to face the semiconductor chip 51. Electrode pads 58 (shown in FIG. 25) provided on the upper surface of the assembly board 53 are soldered to the electrode pins 52.

The assembly board 53 is a multiple-layer substrate well known to the art made of glass-epoxy or ceramic. The assembly board 53 has a plurality of external-connection pins 53a extending downward from the lower surface thereof. A frame member 54 is provided on the upper surface of the assembly board 53, and a lid member 55 is connected to the top of the frame member 54. Thus, the semiconductor chip 51 is sealed in a space defined by the assembly board 53, the frame member 54, and the lid member 55 so that the protection of the semiconductor chip 51 is assured.

In this embodiment, at the points of connection between the electrode pins 52 and the assembly board 53, a displacement-restricting resin 56 is provided in order to control the displacements of the electrode pins 52. The displacement-restricting resin 56 is made of a resin such as thermosetting polyimide, and is in a solid state in the completed semiconductor device 50 of FIG. 22.

Usually, there is a difference in thermal expansion coefficients between the semiconductor chip 51 and the assembly board 53, since the semiconductor chip 51 is a silicon substrate with semiconductors and wirings formed thereon and the assembly board 53 is glass-epoxy or ceramic. When heat is applied to the semiconductor device 50, stress is caused to be generated by the difference in thermal expansion coefficients. The stress thus generated is applied to the electrode pins 52 connecting between the semiconductor chip 51 and the assembly board 53.

FIGS. 23A and 23B show enlarged views of the points of connection between the electrode pins 52 and the assembly board 53. As described above, the stress caused to be generated by the difference in thermal expansion coefficients between the semiconductor chip 51 and the assembly board 53 is applied to the electrode pins 52. Thus, the electrode pins 52 are urged in a direction shown by arrows in the figures. As shown in FIG. 23B, without the displacement-restricting resin 56, the stress concentrates on a solder 57 connecting the electrode pins 52 with the assembly board 53. In the case of too strong stress, the electrode pins 52 break off from the assembly board 53.

As shown in FIG. 23A, in this embodiment of the semiconductor device 50, the displacement-restricting resin 56 is provided at the points of connection between the electrode pins 52 and the assembly board 53. Thus, stress applied to the points of connection can be broadly distributed because of the displacement-restricting resin 56 rather than being concentrated. Also, the displacements of the electrode pins 52 in the direction shown by the arrows are limited by the displacement-restricting resin 56.

Accordingly, even when stress is cause to be generated by the difference in thermal expansion coefficients, the stress does not concentrate on the points of connection, and the displacements of the electrode pins 52 can be limited by the displacement-restricting resin 56. Thus, break-off of the solder 57 and the break-off of the electrode pins 52 from the assembly board 53 can be prevented, and the reliability of the semiconductor device 50 can be enhanced.

Figure 24:
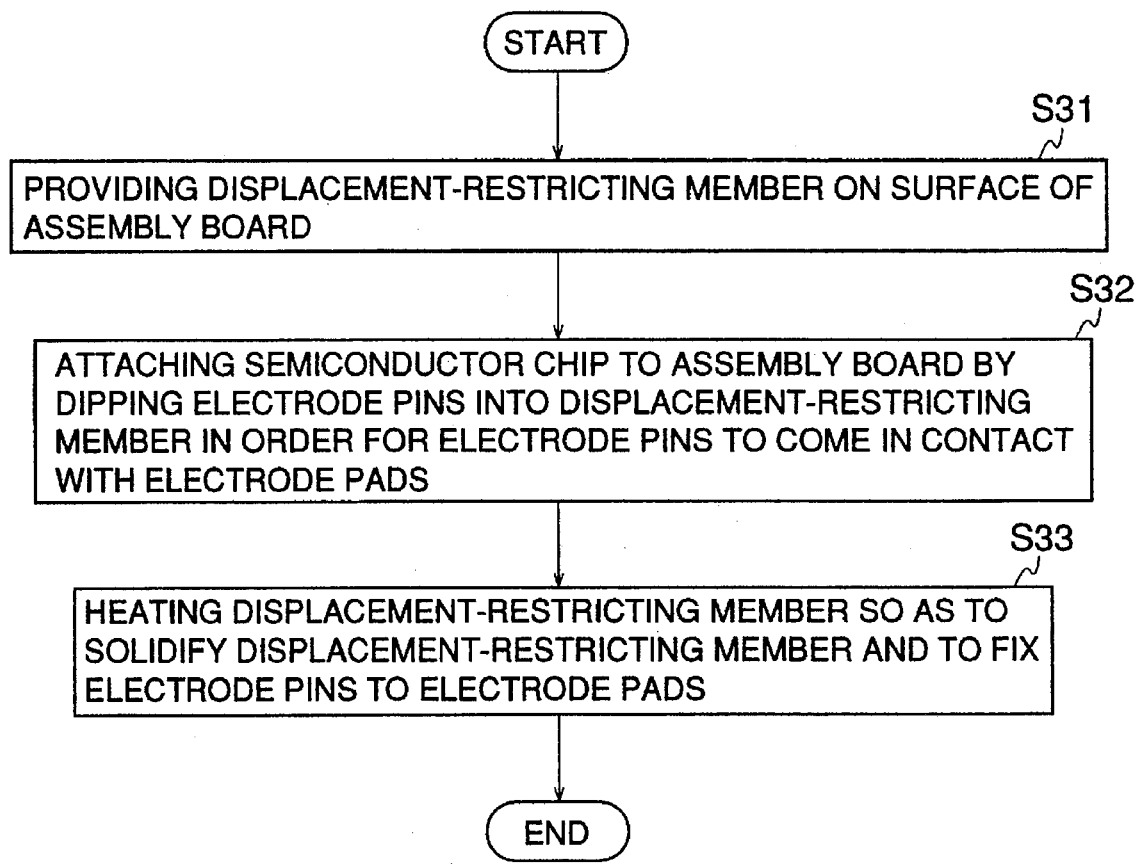
FIG. 24 is a flow chart of a method of forming a semiconductor device according to the second principle.

FIG. 24 shows a flow chart of a method of forming the semiconductor device 50.

At a step S31, a displacement-restricting member of a thermosetting resin is provided on the upper surface of the assembly board. At this point of time, the displacement-restricting member has a viscosity to a certain extent, so that it is in a half-solid and half-liquid state.

At a step S32, the semiconductor chip is attached to the assembly board by pushing the semiconductor chip against the assembly board, so that the electrode pins are dipped into the displacement-restricting member to come in contact with the electrode pads on the assembly board.

At a step S33, heat is applied to the displacement-restricting member so that the displacement-restricting member is solidified to fix the electrode pins to the electrode pads.

In this manner, the semiconductor device 50 is formed. Details of the method of forming the semiconductor device 50 will be described below with reference to FIG. 25 through FIG. 27.

Figure 26:
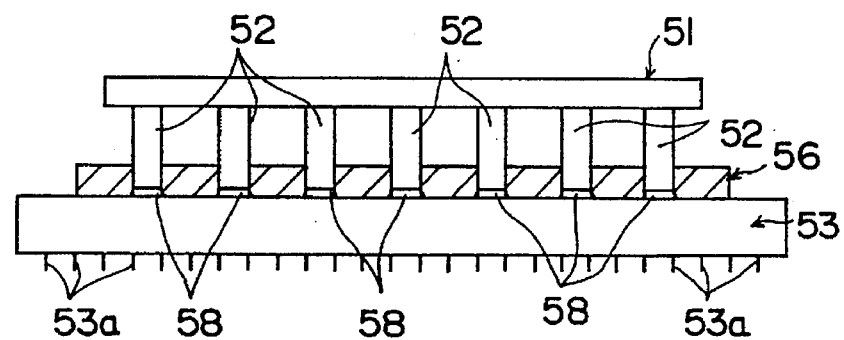
FIG. 26 is an illustrative drawing showing the semiconductor chip mounted on the assembly board in which the electrode pins are in contact with electrode pads.
Figure 27:
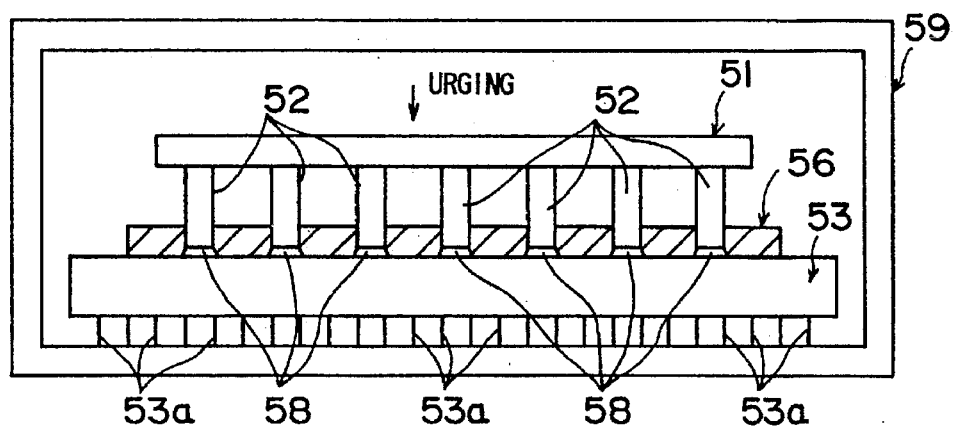
FIG. 27 is an illustrative drawing showing a process of heating the semiconductor device so as to solidify the displacement-restricting resin.

FIG. 25 through FIG. 27 are illustrative drawings explaining a method of forming the semiconductor device 50. FIG. 25 through FIG. 27 show only a method of connecting the electrode pins 52 with the assembly board 53, which method is an essence of the second principle of the present invention.

As shown in FIG. 25, the electrode pins 52 are connected to the semiconductor chip 51 in advance. Also, the displacement-restricting resin 56 in a liquid state is pasted on the upper surface of the assembly board 53. Since the displacement-restricting resin 56 is thermosetting resin, it keeps the state of half-liquid and half-solid with a predetermined viscosity before being subject to a heat process. Because of the viscosity, the displacement-restricting resin 56 can serve as an adhesive.

Then, as shown in FIG. 26, the semiconductor chip 51 is moved downward while the electrode pins 52 are positioned over the electrode pads 58 formed on the assembly board 53. In this manner, the electrode pins 52 are dipped into the displacement-restricting resin 56 to come in contact with the electrode pads 58. Since the displacement-restricting resin 56 can serve as an adhesive as described above, the semiconductor chip 51 is temporarily attached to the assembly board 53 in such a position that the electrode pins 52 are dipped into the displacement-restricting resin 56.

The assembly board 53 temporarily attached with the semiconductor chip 51 is mounted in to an isothermal treatment device 59 to be subject to a heat process, as shown in FIG. 27. In the heat process, the semiconductor chip 51 is urged toward the assembly board 53 in order to assure connections between the electrode pins 52 and the electrode pads 58. The displacement-restricting resin 56 is solidified by heat in the heat process so as to have a function to limit the displacements of the electrode pins 52. Then, the frame member 54 and the lid member 55 are provided to form the semiconductor device 50 shown in FIG. 21. In this manner, the displacement-restricting resin 56 can be readily provided by pasting the displacement-restricting resin 56 on the assembly board 53 and carrying out the heat process.

Figure 28:
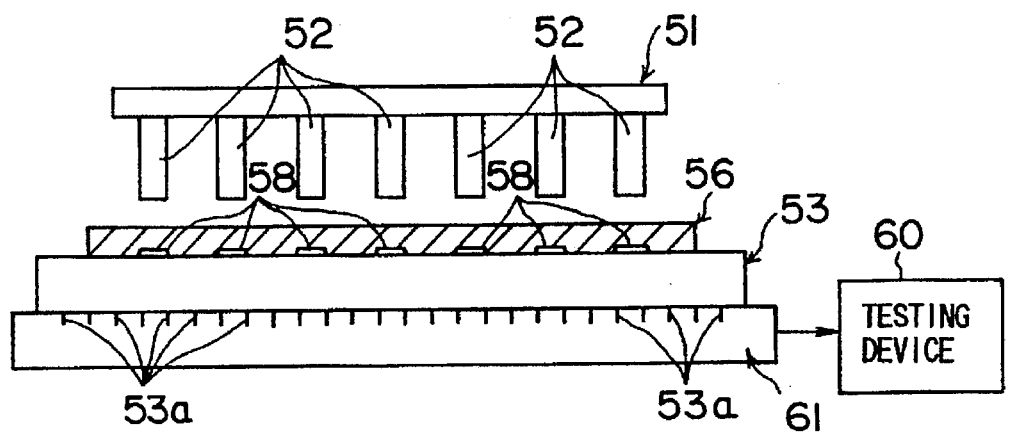
FIG. 28 is an illustrative drawing showing a configuration of testing the semiconductor chip.
Figure 29:
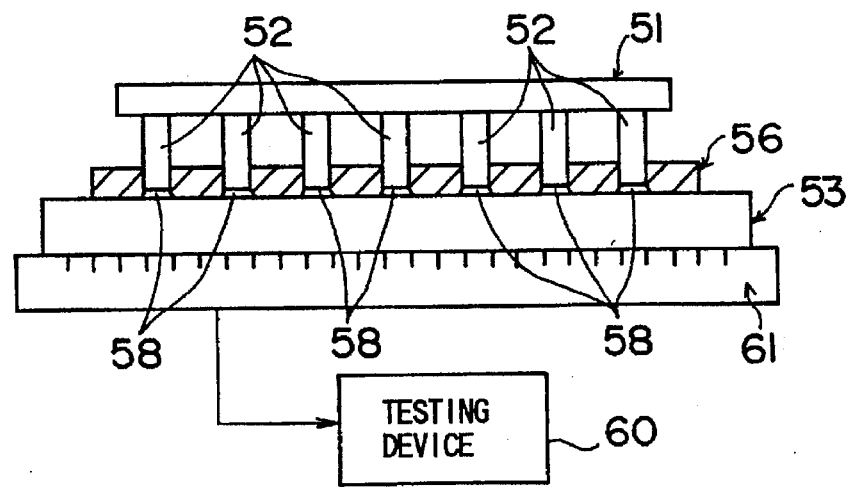
FIG. 29 is an illustrative drawing showing a process of testing the semiconductor chip before the semiconductor chip is connected to the assembly board.

FIG. 28 and FIG. 29 are illustrative drawings showing a method of testing the semiconductor chip 51 which has been temporarily attached to the assembly board 53.

In this embodiment, as shown in FIG. 28, the assembly board 53 is attached in advance to a testing socket 61 which is connected to a testing device 60 for testing the semiconductor chip 51. In FIG. 29, the semiconductor chip 51 is connected to the assembly board 53 so as to connect the electrode pins 52 with the electrode pads 58. Since the electrode pads 58 are coupled to the external-connection pins 53a, the semiconductor chip 51 is coupled to the testing device 60 via the assembly board 53 and the testing socket 61. In this positioning, the testing device 60 carries out a predetermined test on the semiconductor chip 51.

The test on the semiconductor chip 51 is conducted while the semiconductor chip 51 is temporarily attached to the assembly board 53, i.e., before the displacement-restricting resin 56 is solidified. Thus, in the case that a defect is detected in the semiconductor chip 51 during the test, the semiconductor chip 51 having the defect can be removed from the assembly board 35. Then, another semiconductor chip 51 can be attached to the assembly board 53, and the test can be conducted again. This enables only the semiconductor chip 51 without a defect to be mounted on the assembly board 53, thus increasing the yield of the semiconductor chip 50.

Figure 30:
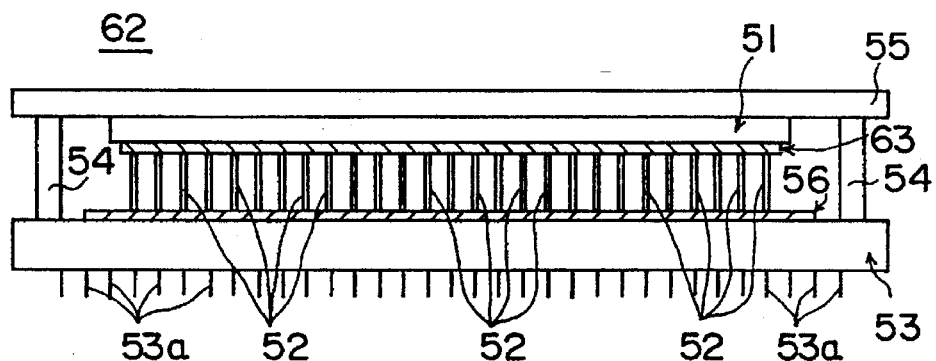
FIG. 30 is an illustrative drawing showing a second embodiment of a semiconductor device according to the second principle of the present invention.

FIG. 30 shows a second embodiment of a semiconductor device according to the second principle of the present invention.

A semiconductor device 62 of FIG. 30 is characterized in that a displacement-restricting resin 63 is provided at connecting points between the electrode pins 52 and the semiconductor chip 51 in addition to the displacement-restricting resin 56 at the connecting points between the electrode pins 52 and the assembly board 53.

As described above, the stress generated by the difference in thermal expansion coefficients between the semiconductor chip 51 and the assembly board 53 is applied to the electrode pins 52. In the first embodiment of the second principle of the present invention, only the stress applied to the points of connection between the electrode pins 52 and the assembly board 53 is taken into consideration. Thus, the displacement-restricting resin 56 is provided in order to prevent the electrode pins 52 from breaking off from the assembly board 53.

However, the stress is also applied to the connecting points between the electrode pins 52 and the semiconductor chip 51. In the second embodiment, the displacement-restricting resin 63 is also provided at those connecting points. Thus, the stress is prevented from concentrating on the connecting points between the electrode pins 52 and the semiconductor device 51, and the displacement of the electrode pins 52 is limited. This leads to the electrode pins 52 being prevented from breaking off from the semiconductor chip 51, and the reliability of the semiconductor device 62 can be enhanced.

Figure 31:
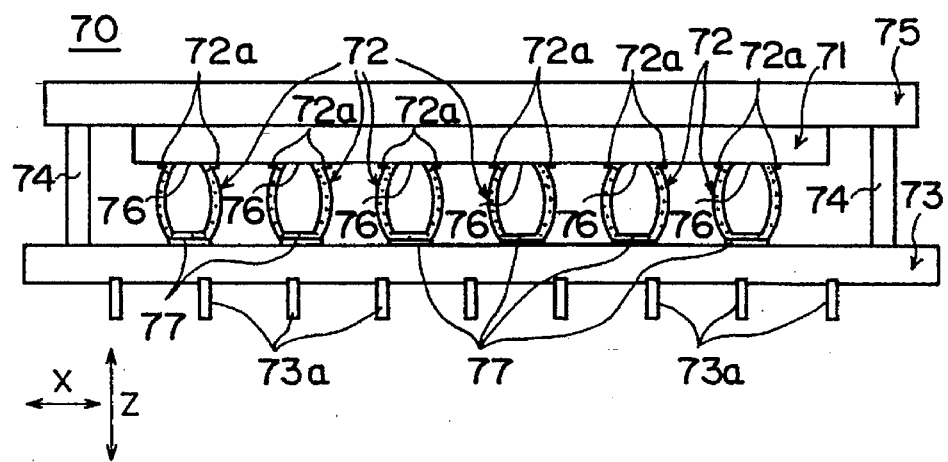
FIG. 31 is an illustrative drawing showing a first embodiment of a semiconductor device according to a third principle of the present invention.

FIG. 31 shows a first embodiment of a semiconductor device according to a third principle of the present invention.

In FIG. 31, a semiconductor device 70 comprising a semiconductor chip 71 is attached with protruding electrodes (bumps) 72, which is an essence of the third principle of the present invention. An assembly board 73 is positioned to face the semiconductor chip 71. Electrode pads 77 provided on the upper surface of the assembly board 73 are connected with the protruding electrodes 72 by using solder and the like.

The assembly board 73 is a multiple-layer substrate well known to the art made of glass-epoxy or ceramic. The assembly board 73 has a plurality of external-connection pins 73a extending downward from the lower surface thereof. A frame member 74 is provided on the upper surface of the assembly board 73, and a lid member 75 is connected to the top of the frame member 74. Thus, the semiconductor chip 71 is sealed in a space defined by the assembly board 73, the frame member 74, and the lid member 75 so that the protection of the semiconductor chip 71 is assured.

The protruding electrodes 72 are made of such a material as copper (Cu) or gold (Au) which is conductive and pliable. The protruding electrodes 72 have a cross section of an ellipse shape. Also, the protruding electrodes 72 have a hollow structure and an opening 76 at the top. A rim 72a of the opening 76 is connected to electrodes (not shown) of the semiconductor chip 71. Since the protruding electrodes 72 have a hollow structure, the protruding electrodes 72 can be distorted relatively easily. They can be distorted in response to both a force applied in a direction in which the semiconductor chip 71 and the assembly board 73 face each other (shown by an arrow Z) and a force applied in a direction shown by an arrow X.

Even when the stress is caused to be generated by a difference in thermal expansion coefficients between the semiconductor chip 71 and the assembly board 73, the protruding electrodes 72 can be distorted to absorb the stress. This leads to the break-off of the protruding electrodes 72 from the electrode pads 77 being prevented.

Also, a manufacturing variation in the height of the protruding electrodes 72 along in the direction shown by the arrow Z can be absorbed by the protruding electrodes 72 distorting accordingly. This can be done by urging the semiconductor chip 71 against the assembly board 73 so as to distort the protruding electrodes 72.

With the protruding electrodes 72 having a freedom in terms of distorting directions as described above, the electrical connection of the semiconductor chip 71 with the assembly board 73 can be assured. Also, since the semiconductor chip 71 can be made parallel to the assembly board 73 with certainty, the reliability of the semiconductor device 70 can be enhanced.

Also, as described above, there is the opening 76 at the top of the protruding electrodes 72 having a hollow structure, and the rim 72a of the opening 76 is connected to the semiconductor chip 71. In the event of the stress applied to the protruding electrodes 72, the stress is distributed over the rim 72a so that the stress applied per unit area can be reduced. Thus, a crack or break-off at the connecting points between the protruding electrodes 72 and the semiconductor chip 71 can be prevented.

Figure 32:
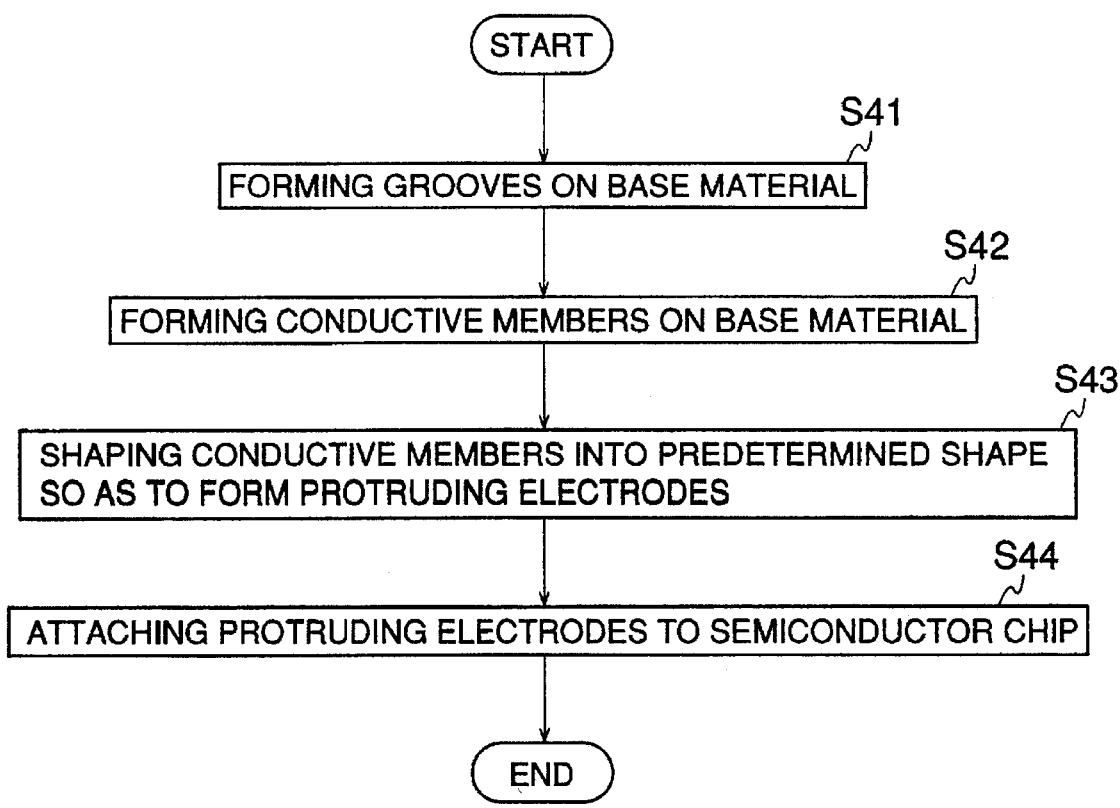
FIG. 32 is a flow chart of a method of forming the semiconductor device of FIG. 31.

FIG. 32 shows a flow chart of a method of forming the protruding electrodes 72 according to the third principle.

At a step S41, grooves are formed on a base material so as to create a pattern for making the protruding electrodes. At a step S42, conductive members are formed as a layer on the base material, where the conductive members are to become the protruding electrodes. At a step S43, the conductive members are shaped into a predetermined shape so as to form the protruding electrode. At a step S44, the protruding electrodes thus formed are attached to a semiconductor chip.

In this manner, the protruding electrodes which have a hollow structure described above are formed on the semiconductor chip. Details of the method of forming the protruding electrodes 72 will be described below with reference to FIG. 33 to FIG. 37.

FIG. 33 through FIG. 37 are illustrative drawings for explaining a method of forming the semiconductor device 70 of the first embodiment of the third principle. Since the point of novelty of the third principle rests on the protruding electrodes 72, only a method of forming the protruding electrodes 72 will be described.

Figure 33:
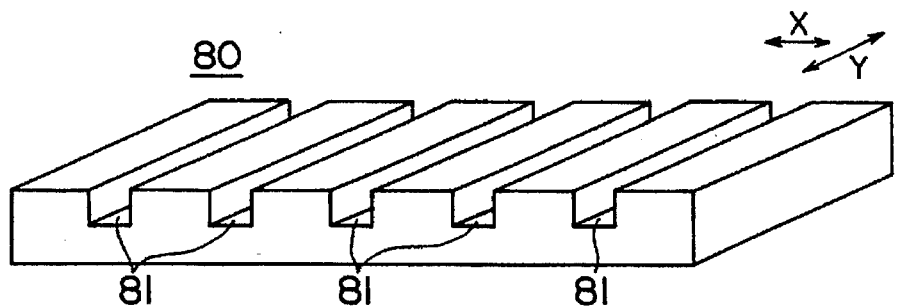
FIG. 33 is an illustrative drawing showing first grooves formed on a substrate.

As shown in FIG. 33, a substrate 80 of a plane shape made of a silicon resin or polyimide is prepared, and first grooves 81 are formed in a direction shown by an arrow Y at predetermined intervals. The forming of the first grooves 81 is carried out by laser processing, etching processing by using URESOLVE-HYDRAZINE and the like, or a photolithograph technique. The predetermined intervals at which the first grooves 81 are formed correspond to intervals of the protruding electrodes 72.

Figure 34:
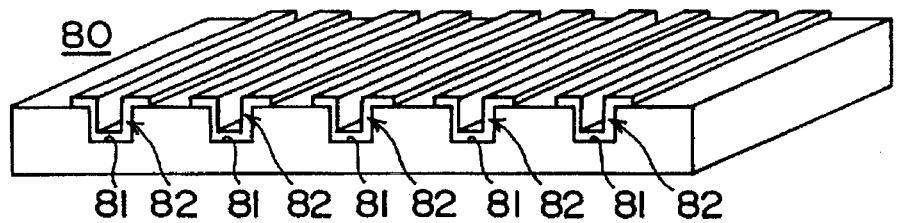
FIG. 34 is an illustrative drawing showing conductive members formed as a layer on the substrate of FIG. 33.
Figure 35:
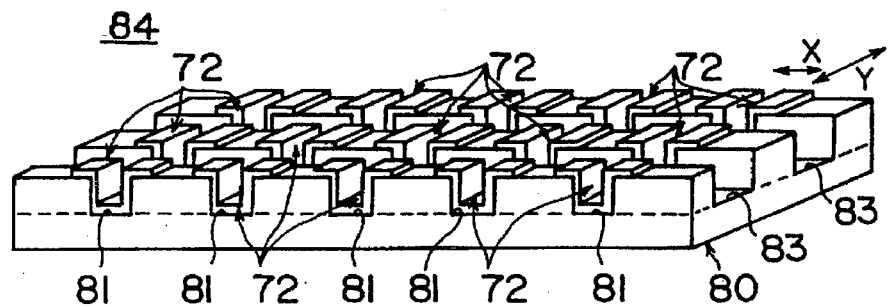
FIG. 35 is an illustrative drawing showing second grooves formed on the substrate so as to cut the conductive members to form protruding electrodes.

After the first grooves 81 are formed on the substrate 80, an exfoliation layer and a conducting portion with the thickness of 1000 Å to 2000 Å are formed by sputtering molybdenum (Mo), chromium (Cr), or titanium (Ti). Then, after a mask forming a predetermined pattern is formed, a layer of such as copper (Cu) or gold (Au) is formed with the thickness of 10 to 50 μm by electroplating. Thus, conductive layers 82 are formed on the first grooves 81, as shown in FIG. 34. The mask pattern mentioned above is formed so as to form the conductive layers 82 shown in FIG. 32. In forming the conductive layers 82, the conductive layers 82 are not required to be strongly attached to the exfoliation layer. This is because the conductive layers 82 are removed from the substrate 80 at a later step, as will be described later.

After the conductive layers 82 are formed on the first grooves 81, second grooves 83 are formed along a direction shown by an arrow X at predetermined intervals. The second grooves 83 may be formed by laser processing, for example. In creating the second grooves 83, the conductive layers 82 are cut into the protruding electrodes 72 shown in FIG. 35. At the time of laser cutting the second grooves 83, the lower half of the substrate 80 (the portion below the dotted line in FIG. 35) is not cut. This is because this lower half is used as a supporting part for supporting the protruding electrodes 72 at predetermined locations.

Figure 36:
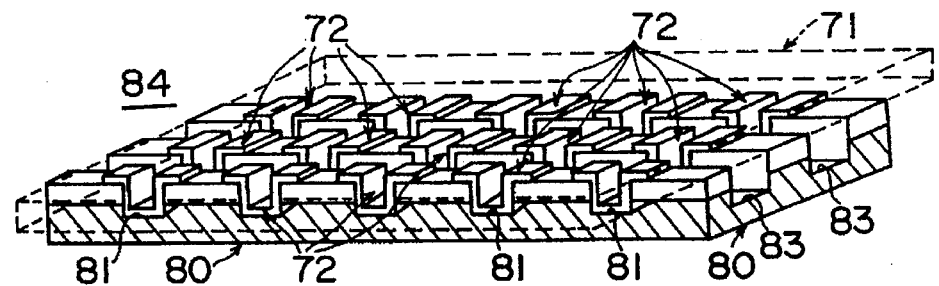
FIG. 36 is an illustrative drawing showing the protruding electrodes of FIG. 35 attached to a semiconductor chip while the substrate remains attached.

After the protruding electrodes 72 are formed, the protruding electrodes 72 are connected to the semiconductor chip 71. As for the joint material used for the connection, brazing metal (e.g., gold/stannum, lead/stannum) or a conductive resin (with gold, silver, or copper as a filler) can be used. FIG. 36 shows the substrate 80 attached with the semiconductor chip 71 (shown by dotted lines).

Figure 37:
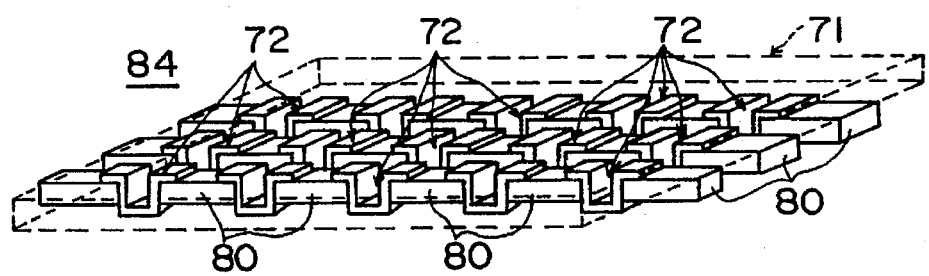
FIG. 37 is an illustrative drawing showing the protruding electrodes attached to the semiconductor chip.

Then, a portion of the substrate 80 shown by hatching in FIG. 36 is removed by etching so as to obtain a complex 84 shown in FIG. 37. Here, keeping the upper portion of the substrate 80 prevents the deformation of the protruding electrodes 72, and helps to keep an orderly arrangement of the protruding electrodes 72. In this positioning, the protruding electrodes 72 are connected to the assembly board 73, and, then, the substrate 80 is removed by etching and the like. Thus, the semiconductor device 70 shown in FIG. 31 is completed.

In the above-described method, the protruding electrodes 72 can be formed by forming the grooves 81 on the substrate 80 to correspond to a shape of the protruding electrodes 72, forming the conductive layers 82 on the grooves 81, and shaping the conductive layers 82 into a predetermined shape. Thus, the protruding electrodes 72 can be readily formed in a simple process.

In the above-described method, an example has been particularly given with regard to a case in which the lower portion of the substrate 80 is first removed, and, then, the remaining substrate 80 is removed after the protruding electrodes 72 are connected to the assembly board 73. However, the substrate 80 in its entirety may be removed at a processing step shown in FIG. 36.

Also, the above description has been given particularly with regard to the method of connecting the protruding electrodes 72 with the semiconductor chip 71. However, depending on a configuration of semiconductor devices, the protruding electrodes 72 may be connected to the assembly board 73, and, then, connected to the semiconductor chip 71.

As a variation of the method of this embodiment, a method in the following may be employed. First, the protruding electrodes 72 are formed by the same method as this embodiment. Then, the protruding electrodes 72 are connected to the semiconductor chip 71. Since the exfoliation layer of such a material as chromium is provided on the substrate 80, pulling the semiconductor chip 71 from the substrate 80 results in the protruding electrodes 72 being removed from the substrate 30 and remaining on the side of the semiconductor chip 71. Thus, the protruding electrodes 72 can be formed in a considerably simple process.

Figure 38:
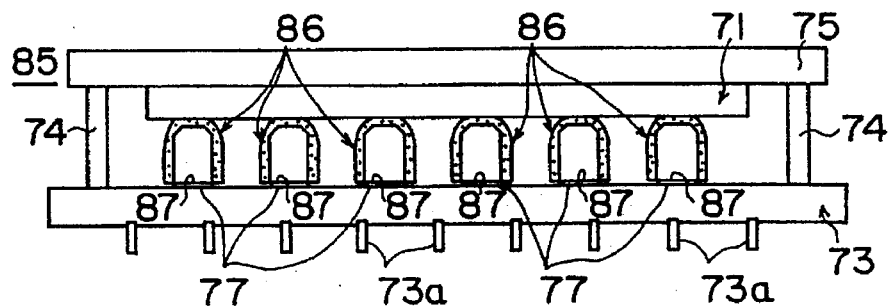
FIG. 38 is an illustrative drawing showing a second embodiment of the semiconductor device according to the third principle of the present invention.

FIG. 38 shows a second embodiment of a semiconductor device according to the third principle of the present invention.

A semiconductor device 85 in this embodiment is characterized in that an opening 87 formed on protruding electrodes 86 is provided to face the assembly board 73. This configuration can bring about the same effect as that of the semiconductor device 70 of the first embodiment, thus enhancing the reliability of the semiconductor device 85.

FIG. 39 through FIG. 42 show a method of forming the protruding electrodes 86 of the semiconductor device 85 of the second embodiment. Here, the method of forming the protruding electrodes 86 is basically the same as that of the first embodiment shown in FIG. 33 through FIG. 37, so that only the differences between the two methods will be described below.

Figure 39:
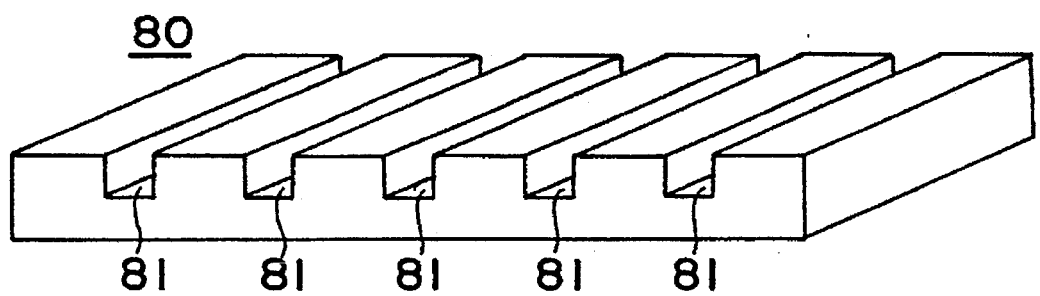
FIG. 39 is an illustrative drawing showing first grooves formed on a substrate.
Figure 40:
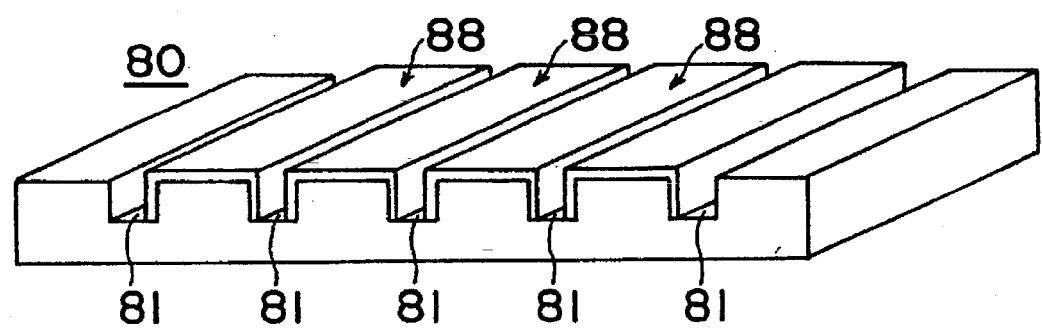
FIG. 40 is an illustrative drawing showing conductive members formed as a layer on the substrate of FIG. 40.

As shown in FIG. 39, first grooves 81 are formed on the substrate 80. Then, conductive layers 88 are formed on the substrate 80 between the first grooves 81 and on the side walls of the first grooves 81, as shown in FIG. 40. Then, second grooves 83 are formed to shape the protruding electrodes 86, as shown in FIG. 41. In FIG. 42, the upper surfaces of the protruding electrodes 86 are connected to the semiconductor chip 71. Finally, the opening side of the protruding electrodes 86 are connected to the assembly board 35. In this manner, the semiconductor device 85 shown in FIG. 38 is completed.

FIGS. 43A to 43D show a variation of the shapes of the protruding electrodes. As shown in FIGS. 43A to 43D, changing the configuration of the masks used in forming the conductive layers 82 and 88 enables various types of protruding electrodes 90 to 93 to be formed. Thus, a selection from a wide variety of protruding electrodes can be made in accordance with the configuration of a semiconductor device. Since the protruding electrodes 90 to 92 have a number of connecting points, stress can be effectively distributed. Also, as shown in FIG. 43D, it is possible to form the protruding electrode 93 having a cylinder shape with a bottom surface.

Figure 44:
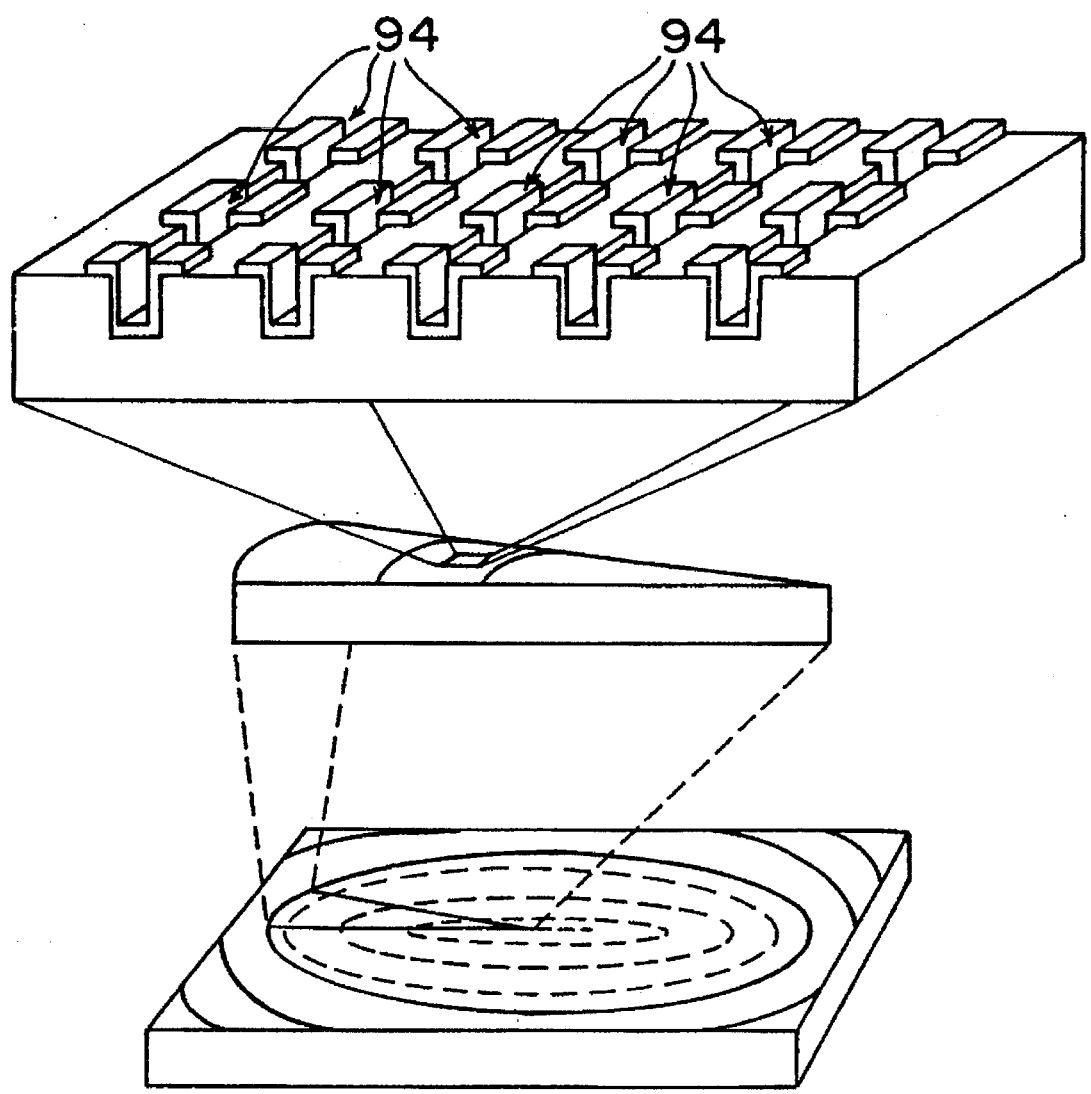
FIG. 44 is an illustrative drawing showing another pattern of the first and second grooves.

FIG. 44 shows a configuration in which protruding electrodes 94 are arranged on circumferences of concentric circles. With this configuration, the generation of stress because of differences in thermal expansion coefficients are moderated.

According to the present invention, effects as follows can be achieved.

According to the present invention, a complex including electrode pins and a fixing member formed in a complex forming process is attached to a semiconductor chip in an electrode-pin connecting process, and, then, the fixing member is removed in a fixing member removal process. Thus, a completed semiconductor device does not have the fixing member attached thereto. Thus, when the semiconductor chip is mounted on the assembly board, there is no stress caused by the differences in thermal expansion coefficients between the semiconductor chip, the assembly board, and the fixing member. Also, the electrode pins are not constrained by the fixing member. Thus, even in the event of the stress caused by the difference in thermal expansion coefficients between the semiconductor chip and the assembly board, the electrode pins can absorb the stress.

Also, according to the present invention, the fixing member is dissolved to be removed. Thus, even after the complex is connected to the semiconductor chip, the fixing member can be readily removed.

Furthermore, according to the present invention, the fixing member is dissolved in the fixing member dissolving process by being subject to an organic solution, sulfate, or heat. Thus, the fixing member can be readily removed with certainty.

Also, according to the present invention, the electrode pins are made of a material which is not affected by the organic solution, sulfate, or heat described above used for dissolving the fixing member. Thus, the electrode pins are affected by no means in the fixing member removal process, and the connection between the semiconductor chip and the assembly board via the electrode pins can be assured.

Furthermore, according to the present invention, substrates are piled one over another with electrode members to become the electrode pins placed therebetween. Also, a resin to become the fixing member is filled in gaps between the substrates and the electrode pins to form a complex block. Then, the complex block is cut into a predetermined size of complexes. Thus, the complex can be formed in simple steps, so that the complex forming process can be simplified. Also, the productivity of the complexes can be enhanced so as to be able to produce the semiconductor devices at a low cost.

Also, according to the present invention, after forming the complex, the fixing member is partially removed in a partial cutting process so as to expose part of the electrode pins. Thus, the electrical connection of the complex with the semiconductor chip can be reliably established.

Furthermore, according to the present invention, wires to become the electrode pins are arranged on insulating substrates, and those insulating substrates with the wires provided thereon are piled one over another to form a complex block. Then, the complex block is cut into a predetermined size of complexes. Since the wires can be arranged with precision by using a wire-bonding device, a precise positioning of the electrode pins relative to electrode pads can be realized.

Also, according to the present invention, grooves or holes are formed on the insulating substrates at the locations of the wires in order to guide the wires and to position the insulating substrates with each other. Thus, the positioning of the insulating substrates with each other can be precisely performed to realize a precise positioning of the electrode pins relative to the electrode pads.

Furthermore, according to the present invention, lowered surfaces are made on two sides of the insulating substrates where the wires are bonded, so that the wires arranged on the insulating substrates are pulled downward by the points of the wire bonding. Thus, slack in the wires can be eliminated. Also, the wires can be precisely positioned, and, hence, the positioning of the electrode pins relative to the electrode pads can be precisely performed.

Also, according to the present invention, a displacement-restricting member is provided at connecting points between electrode pins and electrode pads in order to limit the displacement of the electrode pins. Thus, in the event of the stress caused by the difference in thermal expansion coefficients between a semiconductor chip and an assembly board, the stress is broadly distributed by the displacement-restricting member. Also, since the displacement of the electrode pins are limited by the displacement-restricting member, the electrode pins do not break off from the connecting points. Thus, a reliable electrical connection can be established.

Furthermore, according to the present invention, the displacement-restricting member is also provided at the connecting points between the electrode pins and the semiconductor chip. Thus, the break-off of the electrode pins can be prevented at those connecting points, and a more reliable electrical connection between the semiconductor chip and the assembly board can be established.

Also, according to the present invention, the displacement-restricting member is made of a thermosetting resin, so that the displacement-restricting member can be readily furnished. Also, since a heat process can establish electrical connections an well as mechanical connections of the electrode pins with the assembly board, the connecting process can be readily carried out.

Furthermore, according to the present invention, a testing process is conducted after the semiconductor chip is attached to the assembly board, and, the heat process is carried out after the completion of the testing process. Thus, the semiconductor chip, if defective, can be removed from the assembly board and be replaced before the heat process is conducted. This leads to an increase in the yield of the semiconductor device. Also, even before the heat process, the displacement-restricting member has a viscosity to a certain extent, so that the displacement-restricting member can serve as a temporary attaching member for temporarily attaching the semiconductor chip to the assembly board.

Also, according to the present invention, protruding electrodes are formed such that they can distort in response to both a force applied in a direction perpendicular to and a force applied in a direction parallel to the major surfaces of a semiconductor chip. Thus, even in the event of the stress caused by the difference in thermal expansion coefficients between the semiconductor chip and an assembly board, the protruding electrodes capable of distorting can absorb the stress. Also, when there is a variation in the heights of the protruding electrodes, the protruding electrodes capable of distorting in response to a force applied in a direction perpendicular to the major surfaces of the semiconductor chip can absorb the variation. This is done by pushing the semiconductor chip against the assembly board so as to distort the protruding electrodes. Thus, a reliable electrical connection between the semiconductor chip and the assembly board can be established. Also, the semiconductor chip can be readily made parallel to the assembly board.

Furthermore, according to the present invention, the protruding electrodes capable of distorting can be readily created by forming them as a hollow structure.

Also, according to the present invention, an opening is provided at one end of each protruding electrode which has a hollow structure, so that the stress applied to the protruding electrodes can be distributed over the area of the openings. Thus, the concentration of the stress can be prevented to suppress an occurrence of cracks or break-off.

Furthermore, according to the present invention, the protruding electrodes are formed by making grooves on a base material to correspond to the shape of the protruding electrodes, forming conductive members as a layer on the base material, and shaping the layers of conductive members into a predetermined shape. Thus, a simple manufacturing process can form the protruding electrodes which are capable of distorting as described above.

Further, the present invention is not limited to these embodiments, but various variations and modifications may be made without departing from the scope of the present invention.

What is claimed is:

1. A method of forming a semiconductor device having a semiconductor chip having electrodes on which electrode pins are formed, said method comprising the steps of:

a) forming a complex block having electrode members fixed in a fixing member;

b) cutting said complex block into at least one complex having a planar shape, said at least one complex being said complex, wherein said electrode members are cut into said electrode pins, and an arrangement of said electrode pins corresponding to that of said electrode;

c) connecting said electrode pins with said electrodes by mounting said complex on said semiconductor chip; and d) removing said fixing member from said complex mounted on said semiconductor chip.

2. The method as claimed in claim 1, wherein said step d) removes said fixing member by dissolving said fixing member.

3. The method as claimed in claim 1, wherein said step d) removes said fixing member by melting said fixing member.

4. The method as claimed in claim 1, wherein said step a) forms said complex block by using said fixing member made of a material which can be dissolved by an organic solution, and said step d) removes said fixing member by dissolving said fixing member with said organic solution.

5. The method as claimed in claim 1, wherein said step a) forms said complex block by using said fixing member made of a material which can be dissolved by an acid, and said step d) removes said fixing member by dissolving said fixing member with said acid.

6. The method as claimed in claim 3, wherein said step a) forms said complex block by using said fixing member made of a material which can be melted by heat, and said step d) removes said fixing member by melting said fixing member by heat.

7. The method as claimed in claim 4, wherein said step a) forms said complex block by using said electrode members made of a material which is not affected by said organic solution.

8. The method as claimed in claim 5, wherein said step a) forms said complex block by using said electrode members made of a material which is not affected by said heat melting said fixing member.

9. The method as claimed in claim 6, wherein said step a) forms said complex block by using said electrode members made of material which is not affected by said heat melting said fixing member.

10. The method as claimed in claim 1, wherein said step a) comprises the steps of;

arranging said electrode members on substrates;

piling said substrates with said electrode members placed therebetween;

filling a resin into gaps between substrates and said electrode members, wherein said substrates and said resin form said fixing member.

11. The method as claimed in claim 1, further comprising, before step c), a step of partially removing said fixing member from said complex so as to expose part of said electrode pins.

12. The method as claimed in claim 1, wherein said step a) comprises the steps of:

arranging wires on insulating substrates, said wires being said electrode members; and piling said insulating substrates with said wires placed therebetween while connecting said insulating substrates together, wherein said insulating substrates form said fixing member.

13. The method as claimed in claim 12, further comprising a step of forming grooves on said insulating substrates in order to guide said wires at said step of arranging said wires, and in order to position said insulating substrates with each other at said step of piling said insulating substrates.

14. The method as claimed in claim 12, further comprising a step of forming holes through said insulating substrates in order to guide said wires at said step of arranging said wires, and in order to position said insulating substrates with each other at said step of piling said insulating substrates.

15. The method as claimed in claim 12, wherein said step of arranging said wires further comprises a step of connecting said wires to said insulating substrates by wire bonding.

16. The method as claimed in claim 15, further comprising, before said step of arranging said wires, a step of forming lowered surfaces at two sides of said insulating substrates, said lowered surfaces providing wire-bonding points for said wires, so that said wires arranged on said insulating substrates are pulled downward by said wire-bonding points.

* * * * *